(12) United States Patent
Kim

(10) Patent No.: US 10,608,061 B2
(45) Date of Patent: Mar. 31, 2020

(54) LIGHT EMITTING DISPLAY DEVICE AND METHOD OF MANUFACTURING THE SAME

(71) Applicant: LG DISPLAY CO., LTD., Seoul (KR)

(72) Inventor: JongSung Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/786,178

(22) Filed: Oct. 17, 2017

(65) Prior Publication Data

US 2018/0166517 A1 Jun. 14, 2018

(30) Foreign Application Priority Data

Dec. 14, 2016 (KR) .......................... 10-2016-0170355

(51) Int. Cl.
*H01L 27/32* (2006.01)
*H01L 51/52* (2006.01)

(52) U.S. Cl.
CPC ...... *H01L 27/3246* (2013.01); *H01L 27/3248* (2013.01); *H01L 51/5203* (2013.01); *H01L 51/5253* (2013.01); *H01L 2227/323* (2013.01)

(58) Field of Classification Search
CPC ............. H01L 27/3246; H01L 27/3248; H01L 51/5203; H01L 2227/323; H01L 51/5253
See application file for complete search history.

(56) References Cited

U.S. PATENT DOCUMENTS

| 2005/0073247 A1 | 4/2005 | Yamazaki et al. |
| 2005/0082534 A1 | 4/2005 | Kim et al. |
| 2010/0033804 A1 | 2/2010 | Aoki |
| 2014/0111404 A1 | 4/2014 | Omata et al. |
| 2014/0152171 A1* | 6/2014 | Kondoh ............. H01L 27/3258 313/498 |
| 2014/0312323 A1 | 10/2014 | Park et al. |
| 2015/0053955 A1* | 2/2015 | Furuie ................. H01L 27/3248 257/40 |
| 2015/0060815 A1 | 3/2015 | Sato |

(Continued)

FOREIGN PATENT DOCUMENTS

| JP | 2011-100024 A | 5/2011 |
| JP | 2015-049947 A | 3/2015 |

(Continued)

*Primary Examiner* — Amit Chatly
(74) *Attorney, Agent, or Firm* — Seed Intellectual Property Law Group LLP

(57) ABSTRACT

Disclosed are a light emitting display device and a method of manufacturing the same, which prevent a lifetime of a light emitting layer from being shortened and prevent occurrence of a turn-on defect. The light emitting display device includes a plurality of pixels each including a transistor having a gate electrode, an active layer overlapping the gate electrode, a source electrode connected to one side of the active layer, and a drain electrode connected to another side of the active layer. The pixels further include a light emitting device having a first electrode, a light emitting layer disposed on the first electrode, and a second electrode disposed on the light emitting layer. The light emitting display device includes a contact hole, and the first electrodes of at least two of the pixels are positioned on and electrically connected to respective source electrodes or to respective drain electrodes in the contact hole.

10 Claims, 21 Drawing Sheets

(56) References Cited

U.S. PATENT DOCUMENTS

| | | |
|---|---|---|
| 2015/0123113 A1 | 5/2015 | Park et al. |
| 2015/0144908 A1* | 5/2015 | Yoon .................. H01L 27/3216 257/40 |
| 2016/0276420 A1* | 9/2016 | Oooka .................. H01L 51/525 |
| 2016/0315130 A1 | 10/2016 | Kajiyama et al. |

FOREIGN PATENT DOCUMENTS

| | | |
|---|---|---|
| JP | 2015-90495 A | 5/2015 |
| TW | 201442213 A | 11/2014 |

* cited by examiner

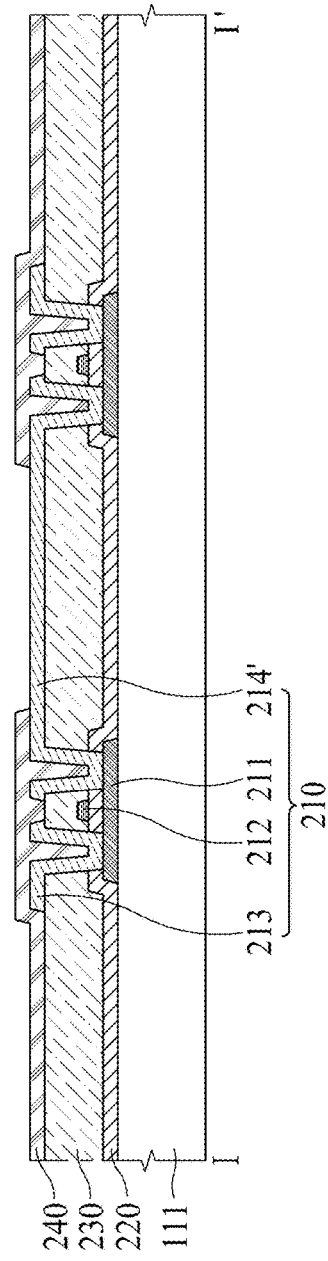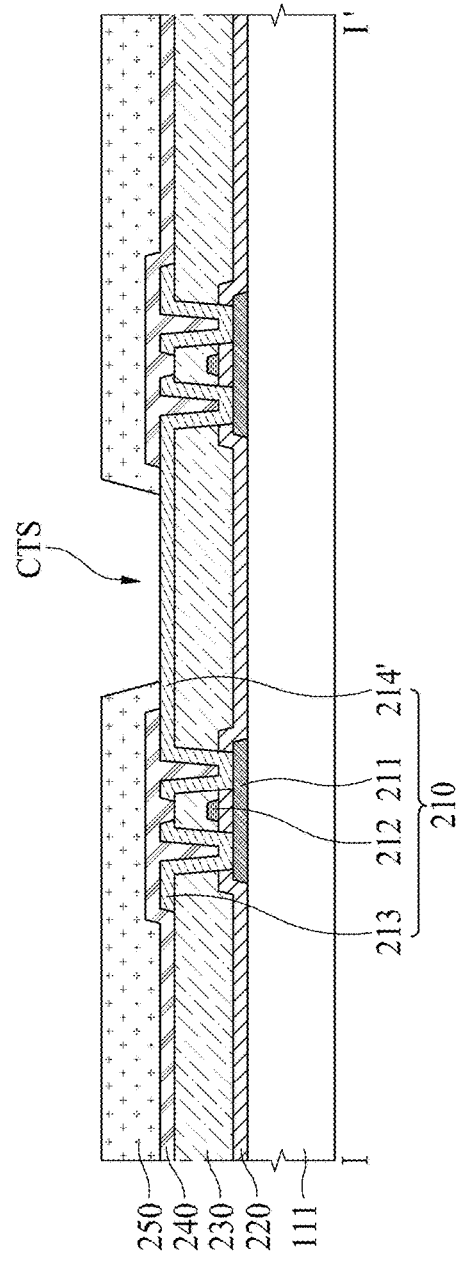

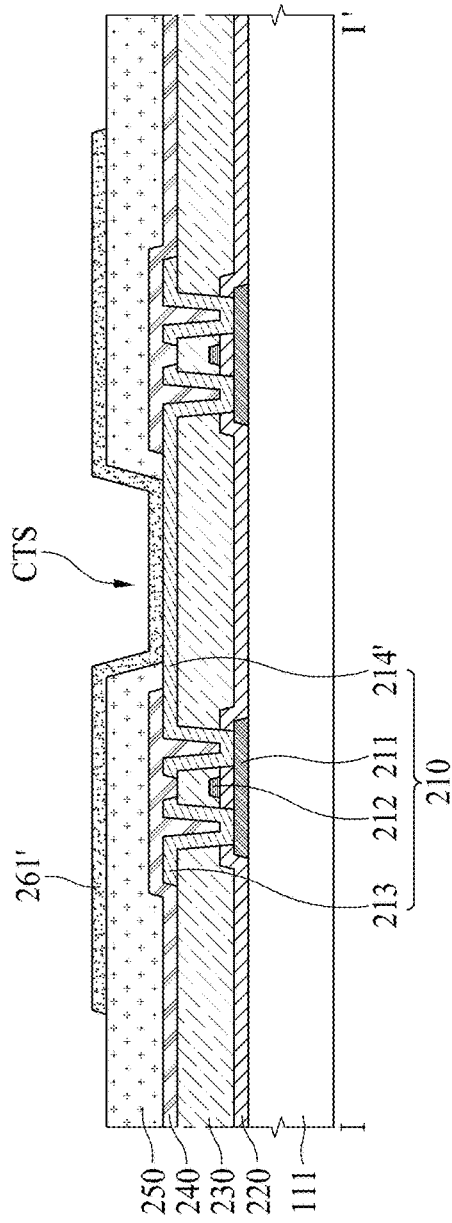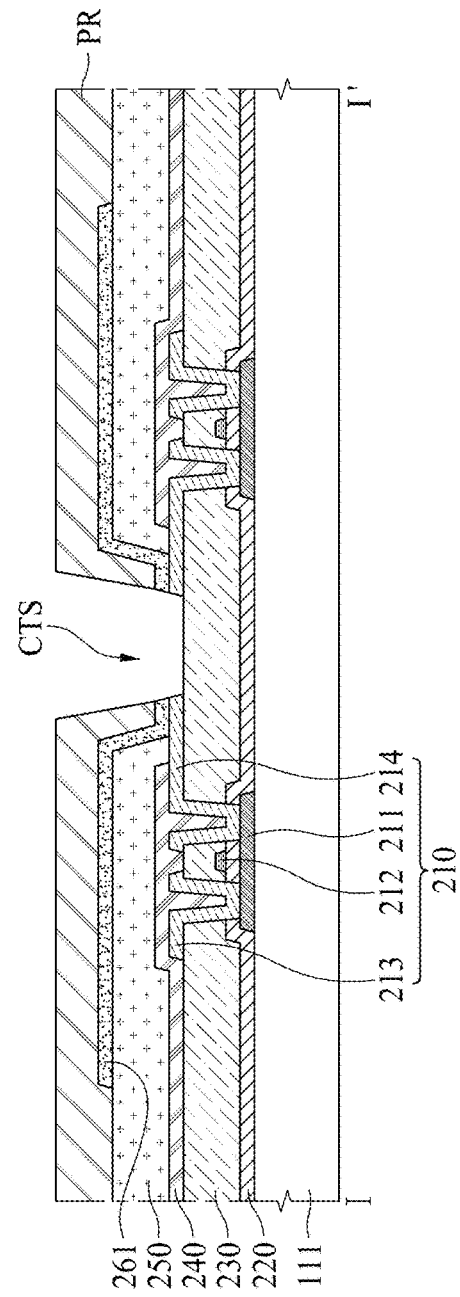

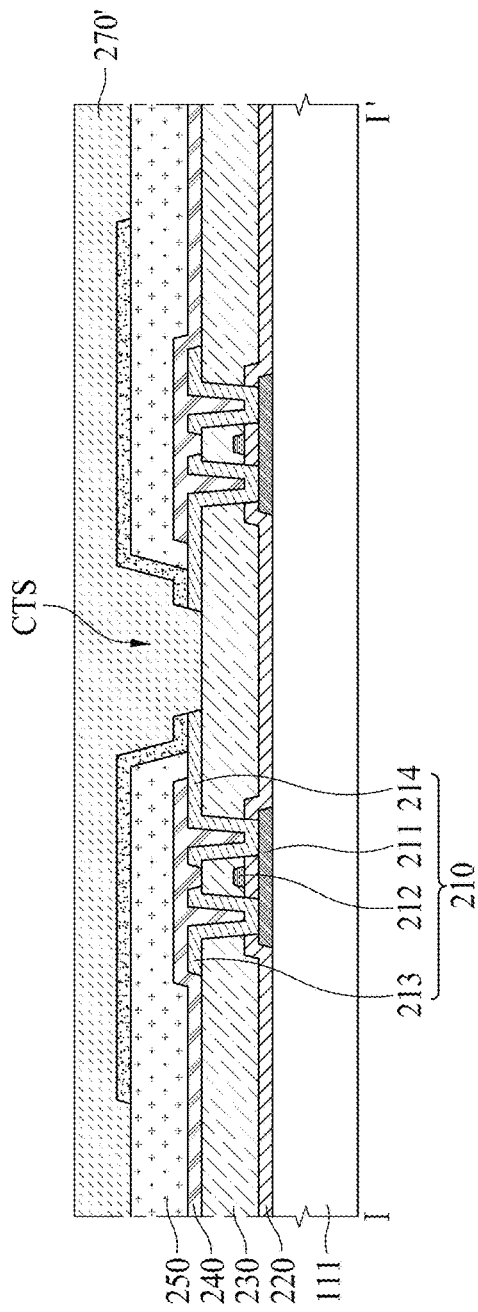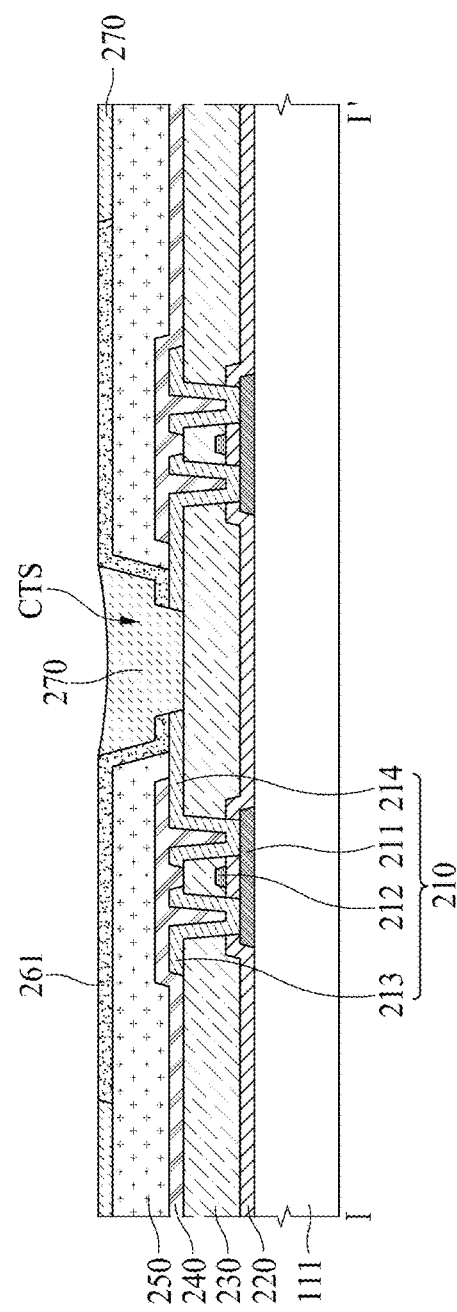

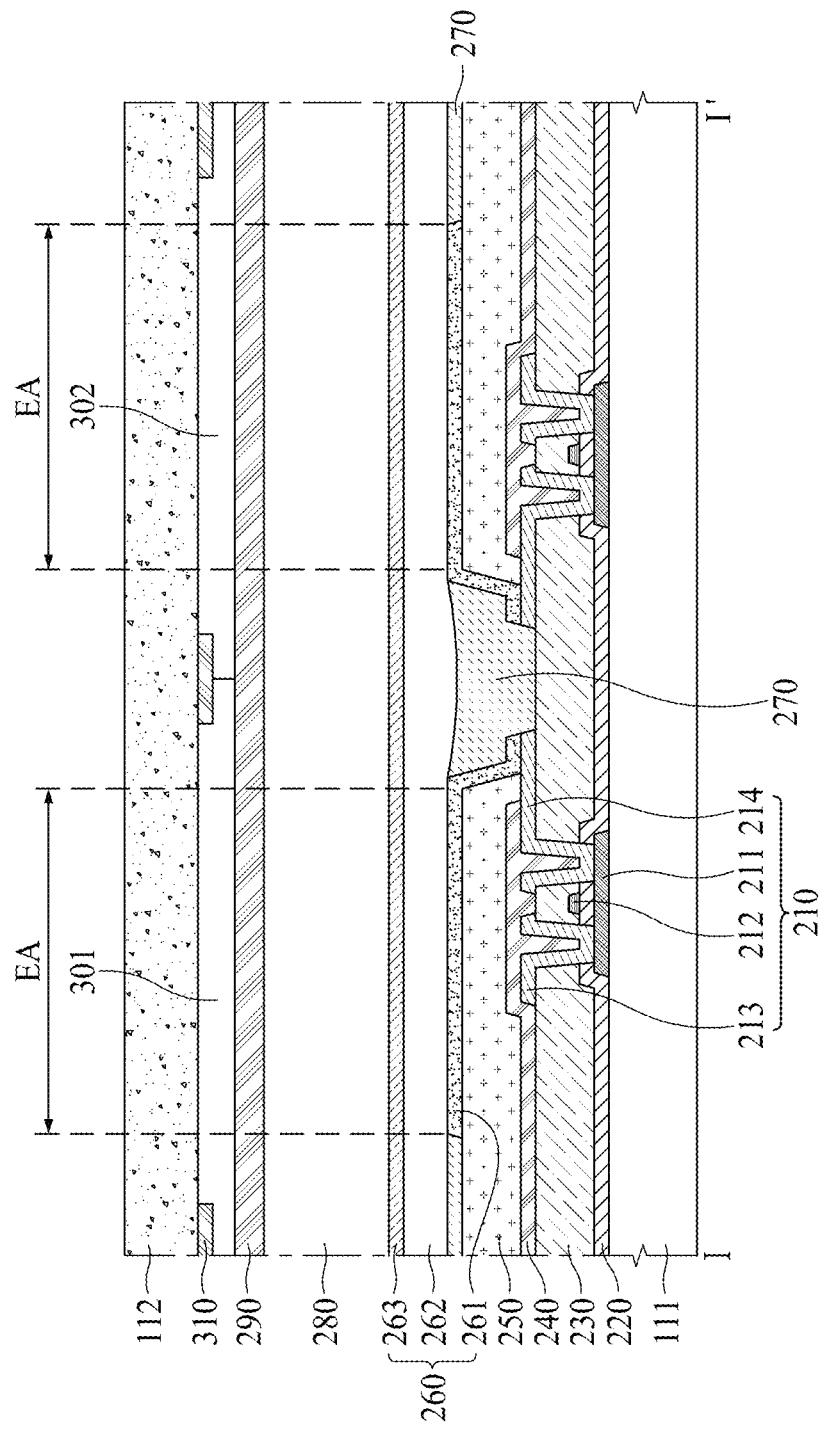

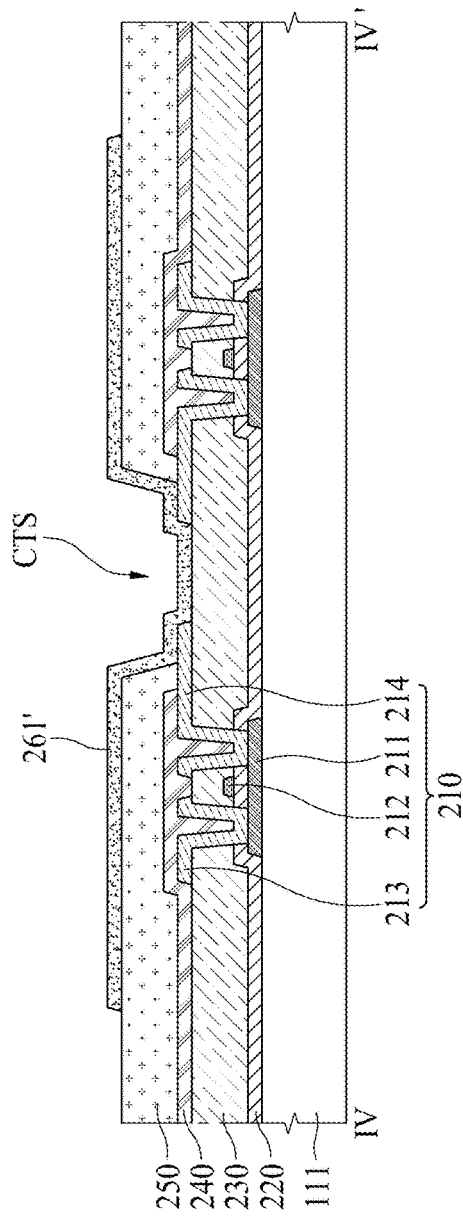
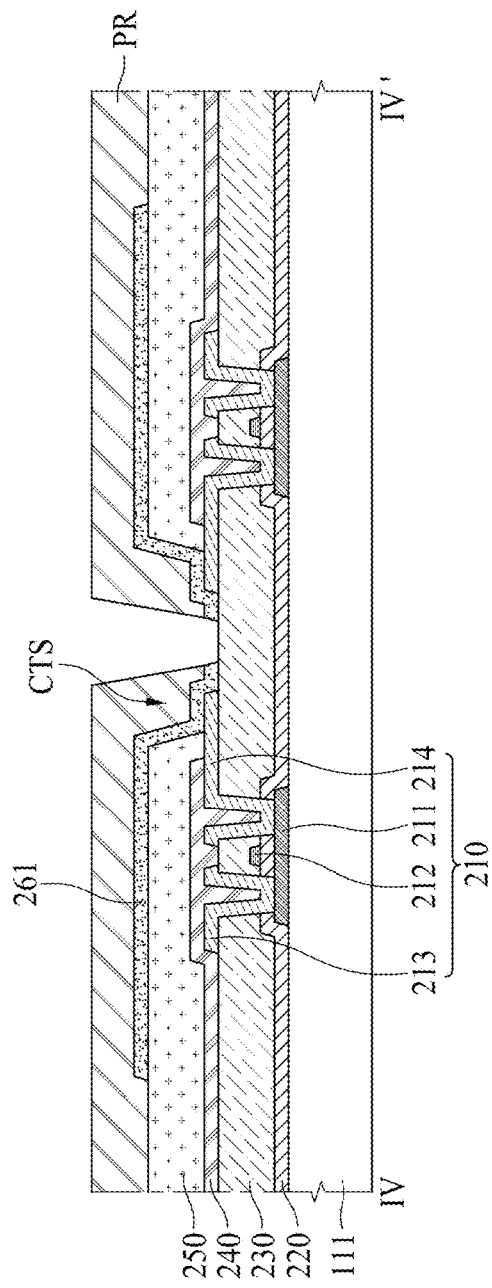

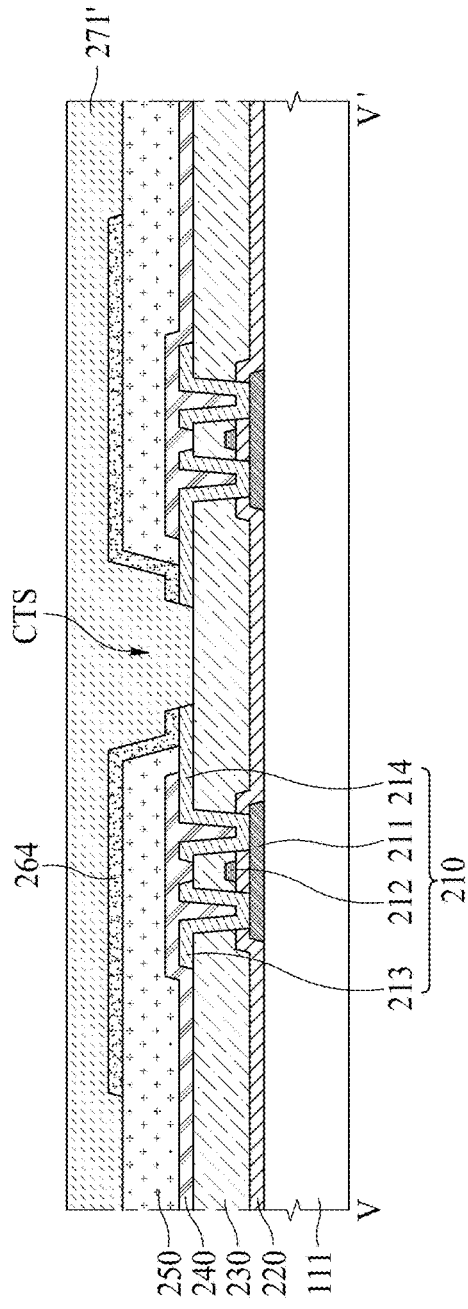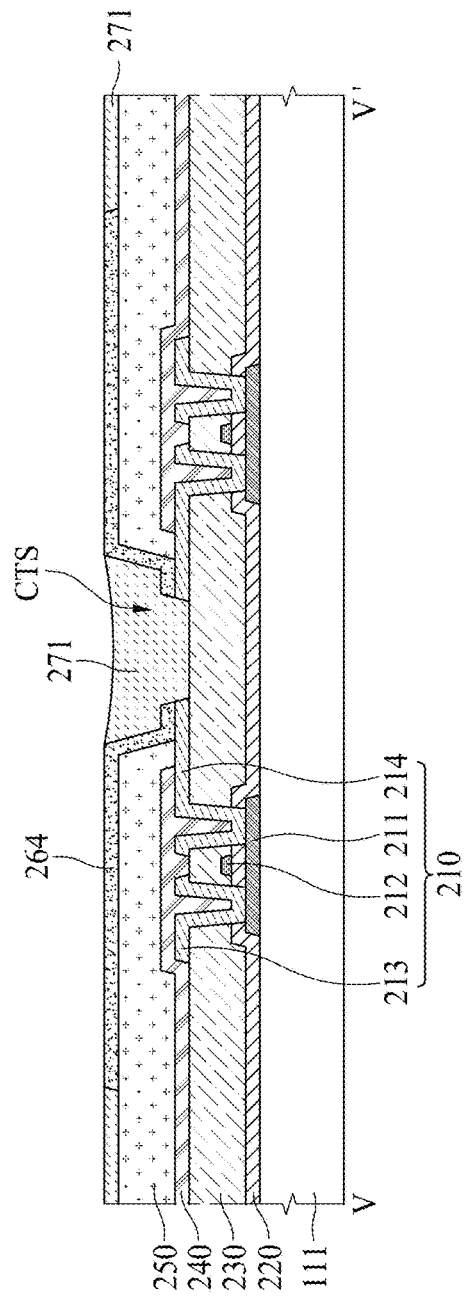

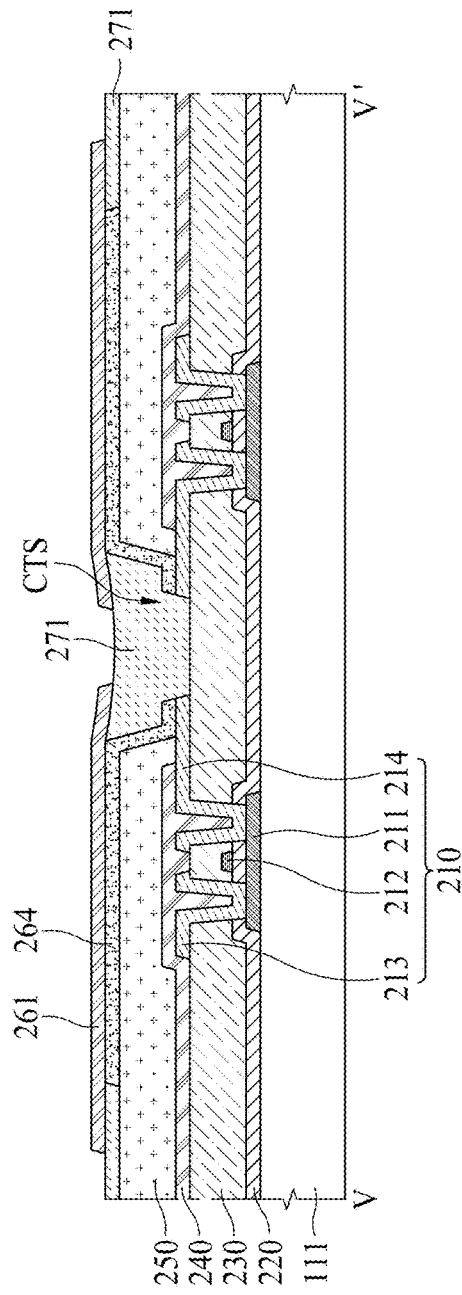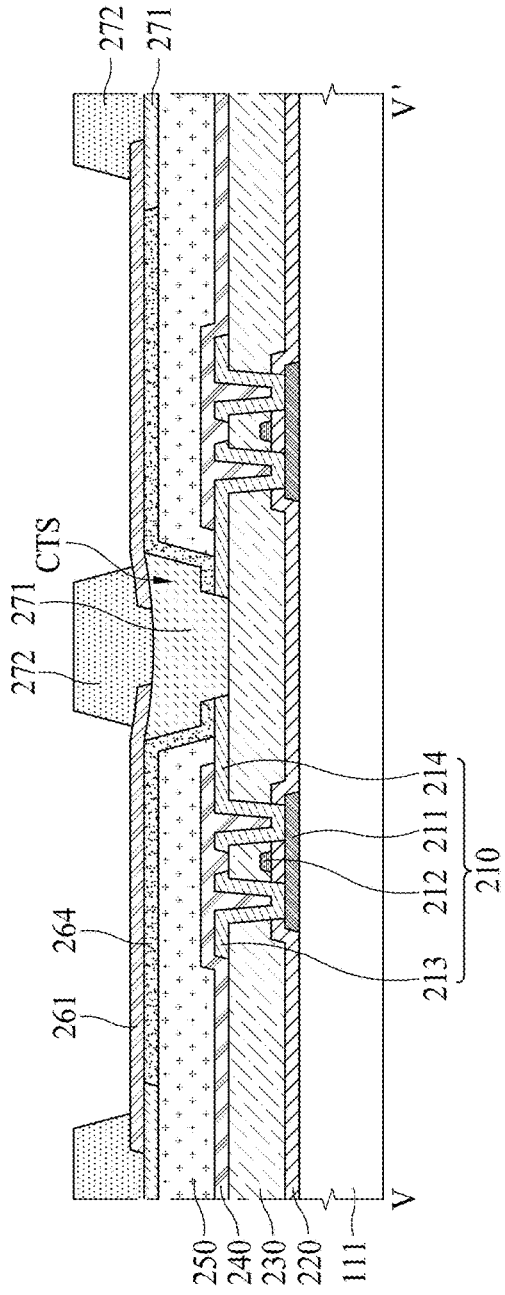

LIGHT EMITTING DISPLAY DEVICE AND METHOD OF MANUFACTURING THE SAME

CROSS-REFERENCE TO RELATED APPLICATIONS

This application claims the benefit of the Korean Patent Application No. 10-2016-0170355 filed on Dec. 14, 2016, which is hereby incorporated by reference as if fully set forth herein.

BACKGROUND

Technical Field

The present disclosure relates to a light emitting display device and a method of manufacturing the same.

Description of the Related Art

With the advancement of information-oriented society, various requirements for display devices for displaying an image are increasing. Therefore, various display devices such as liquid crystal display (LCD) devices, plasma display panel (PDP) devices, light emitting display devices, etc. are being used recently.

The light emitting display devices including organic light emitting display devices are self-emitting display devices and are better in viewing angle and contrast ratio than LCD devices. Also, since the organic light emitting display devices do not need a separate backlight, it is possible to lighten and thin the organic light emitting display devices, and the organic light emitting display devices are excellent in power consumption. Furthermore, the organic light emitting display devices are driven with a low direct current (DC) voltage, have a fast response time, and are low in manufacturing cost.

The organic light emitting display devices each include anode electrodes, a bank that divides the anode electrodes, a hole transporting layer, an organic light emitting layer, and an electron transporting layer that are formed on the anode electrodes, and a cathode electrode formed on the electron transporting layer. In this case, when a high-level voltage is applied to the anode electrode and a low-level voltage is applied to the cathode electrode, a hole and an electron respectively move to the organic light emitting layer through the hole transporting layer and the electron transporting layer and are combined with each other in the organic light emitting layer to emit light.

In the organic light emitting display devices, pixels that emit light are formed in respective areas where an anode electrode, an organic light emitting layer, and a cathode electrode are sequentially stacked. A bank is provided in respective non-emissive areas that do not emit light. That is, the bank functions as a pixel defining layer that defines the pixel.

The anode electrode is connected to a source or drain electrode of a thin film transistor (TFT) through a contact hole and is supplied with a high-level voltage through the TFT. Due to a step height of the contact hole, it is difficult for the organic light emitting layer to be uniformly deposited in the contact hole, and for this reason, the organic light emitting layer is covered by the bank without being formed in the contact hole.

Recently, head-mounted displays each including an organic light emitting display device are being developed. The head-mounted displays are monitor devices for virtual reality (VR) or augmented reality (AR), which are worn in a glasses type or a helmet type and form a focal point at a distance close to eyes of a user. Small organic light emitting display devices, applied to the head-mounted displays, mobile devices, etc., have a high resolution, and thus, a size of each pixel is progressively reduced.

However, the contact hole is formed through a photo process, and due to a limitation of the photo process, the contact hole cannot be formed to have a certain size or less. That is, although a size of a pixel is reduced, there is a limitation in decreasing a size of the contact hole. Particularly, the contact hole is disposed in the non-emissive area, and thus, when the size of the pixel is reduced, an area ratio of the non-emissive area in the pixel increases, and an area ratio of an emissive area in the pixel is decreased. If the area ratio of the emissive area in the pixel is decreased, a luminance of the emissive area should be increased in order to compensate for the decreased ratio of the emissive area, and for this reason, a lifetime of the organic light emitting layer is shortened.

Moreover, if the size of the pixel is reduced, a size of the source or drain electrode of the TFT can become less than that of the contact hole. In this case, the anode electrode is not formed on only an upper surface of the source or drain electrode exposed through the contact hole and may be formed on a floor of the contact hole and a side surface of the source or drain electrode. Therefore, as illustrated in FIGS. 1A and 1B, due to a step height between the floor of the contact hole and the source or drain electrode, the anode electrode can be disconnected in the side surface of the source or drain electrode. For this reason, a turn-on defect where the pixel does not emit light can occur.

BRIEF SUMMARY

Accordingly, the present disclosure is directed to provide a light emitting display device and a method of manufacturing the same that substantially obviate one or more problems due to limitations and disadvantages of the related art.

An aspect of the present disclosure is directed to provide a light emitting display device and a method of manufacturing the same, which prevent a lifetime of a light emitting layer from being shortened.

Another aspect of the present disclosure is directed to provide a light emitting display device and a method of manufacturing the same, which prevent occurrence of a turn-on defect.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a light emitting display device including a plurality of pixels each including: a transistor having a gate electrode, an active layer overlapping the gate electrode, a source electrode connected to one side of the active layer, and a drain electrode connected to another side of the active layer; and a light emitting device having a first electrode, a light emitting layer disposed on the first electrode, and a second electrode disposed on the light emitting layer. A contact hole is included, and the first electrodes of at least two of the pixels are positioned on and electrically connected to respective source electrodes or to respective drain electrodes in the contact hole.

In another aspect of the present disclosure, there is provided a light emitting display device that includes a plurality of pixels, each of the pixels including: a transistor having a gate electrode, a source region, and a drain region; a source electrode coupled to the source region; a drain electrode coupled to the drain region; an auxiliary electrode; and a first electrode of a light emitting device on the auxiliary electrode. The light emitting display device further includes a contact hole, and the auxiliary electrodes of at least two of the pixels are electrically connected to respective source electrodes or to respective drain electrodes in the contact hole.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings:

FIGS. 13A to 13G are cross-sectional views taken along the line I-I' of FIG. 4 for describing a method of manufacturing an organic light emitting display device according to embodiments of the present disclosure;

FIGS. 15A to 15D are cross-sectional views taken along the line IV-IV' of FIG. 8 for describing a method of manufacturing an organic light emitting display device according to another embodiment of the present disclosure;

FIGS. 17A to 17D are cross-sectional views taken along the line V-V' of FIG. 10 for describing a method of manufacturing an organic light emitting display device according to another embodiment of the present disclosure.

DETAILED DESCRIPTION

Figure 1A:
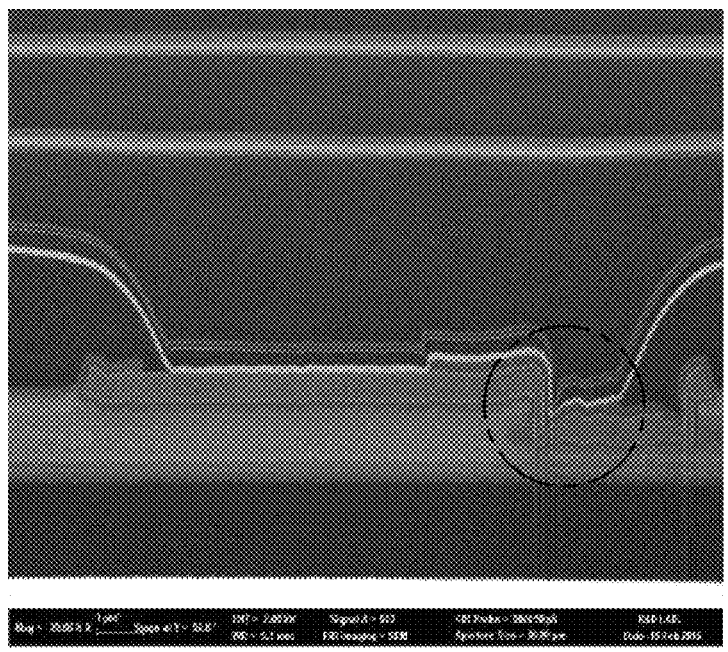
FIGS. 1A and 1B are exemplary diagrams showing an example where when an organic light emitting layer is formed in a contact hole, an anode electrode is short-circuited with a cathode electrode due to a step height of the contact hole.
Figure 1B:
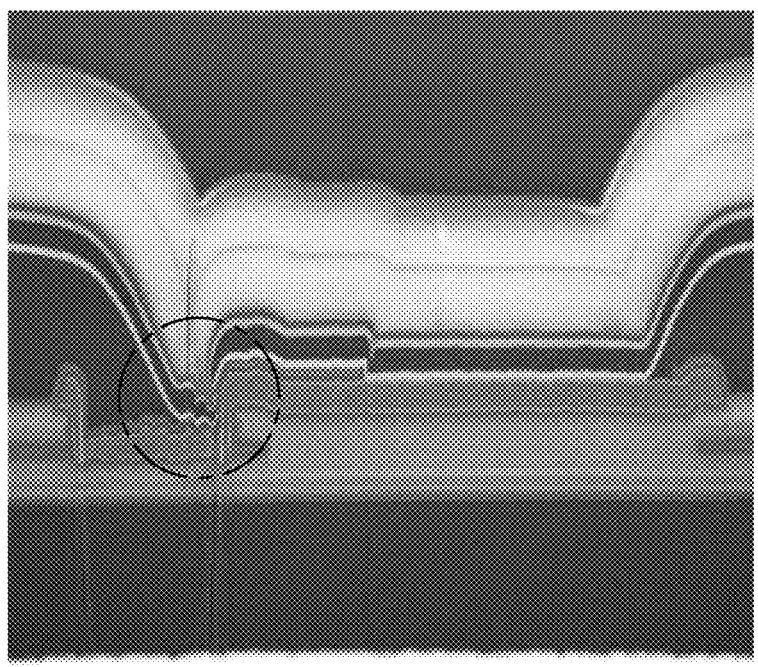

Reference will now be made in detail to the exemplary embodiments of the present disclosure, examples of which are illustrated in the accompanying drawings. Wherever possible or convenient for describing the various embodiments provided herein, the same reference numbers will be used throughout the drawings to refer to the same or like parts.

In the following description, the detailed description of well-known functions, features or configurations may be omitted where inclusion of such description may otherwise obscure the description of the various embodiments of the present disclosure. The terms described in the specification should be understood as follows.

Advantages and features of the present disclosure, and implementation methods thereof will be provided by the following exemplary embodiments described with reference to the accompanying drawings. The present disclosure may, however, be embodied in different forms and should not be construed as limited to the particular embodiments set forth herein. Rather, these embodiments are provided so that this disclosure will be thorough and complete, and will convey the scope of the present disclosure to those skilled in the art.

A shape, a size, a ratio, an angle, and a number disclosed in the drawings for describing embodiments of the present disclosure are merely exemplary, and thus, the present disclosure is not limited to the illustrated details.

Terms such as 'comprise', 'have', and 'include' are used in the present specification to have an inclusive meaning, and additional parts, components, features or the like may be included, unless expressly limited by terms such as 'only'. The terms of a singular form may include plural forms unless explicitly limited to the singular form.

In construing an element, the element is construed as including an error range although there may not be any explicit description of such error range.

In describing a positional relationship, for example, when a positional relation between two parts is described as 'on', 'over', 'under', and 'next', one or more other parts may be disposed between the two parts unless expressly limiting terms such as 'just' or 'direct' are used.

In describing a time relationship, for example, when the temporal order is described as 'after', 'subsequent', 'next', and 'before', a case which is not continuous in order may be included unless expressly limiting terms such as 'just' or 'direct' are used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

An X axis direction, a Y axis direction, and a Z axis direction, as used herein, should not be construed as denoting any particular geometric relationship or orientation (e.g., a vertical or horizontal orientation), but are instead intended to have a broader directionality within a scope where elements of the present disclosure operate functionally.

The term "at least one" should be understood as including any and all combinations of one or more of the associated listed items. For example, the meaning of "at least one of a first item, a second item, and a third item" includes all combinations of two or more of any of the first, second, and third items, as well as any of the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

Hereinafter, exemplary embodiments of the present disclosure will be described in detail with reference to the accompanying drawings.

Figure 2:
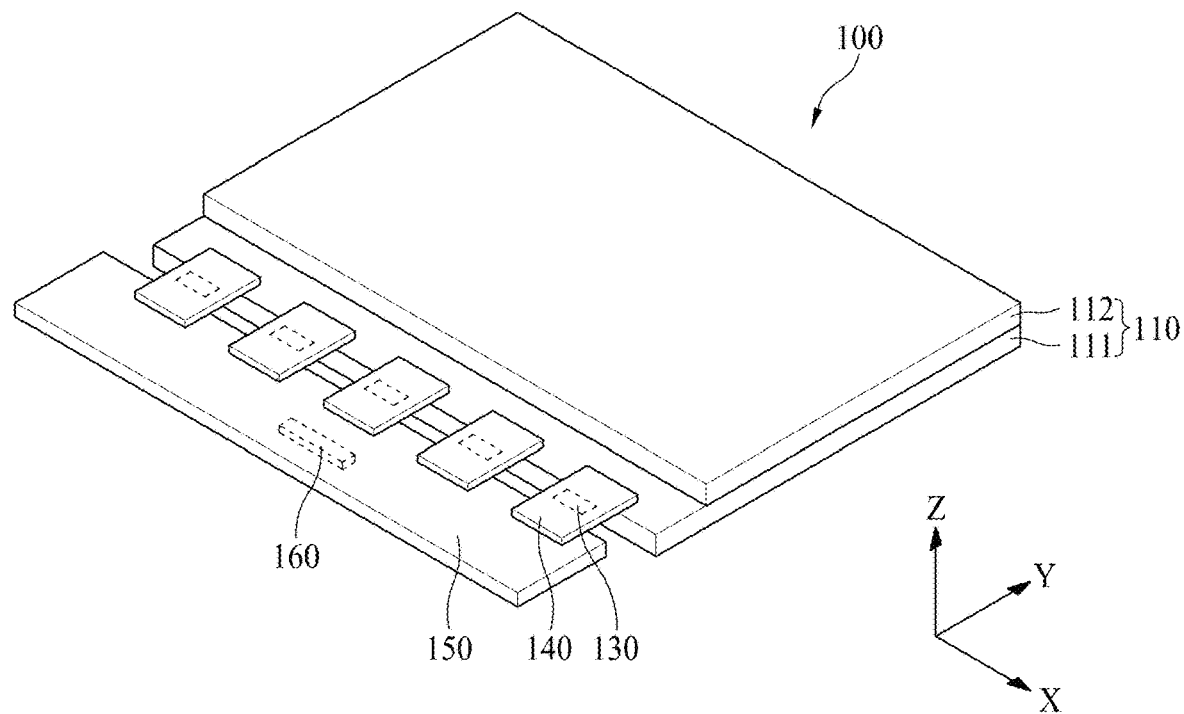
FIG. 2 is a perspective view illustrating an organic light emitting display device according to one or more embodiments of the present disclosure.
Figure 3:
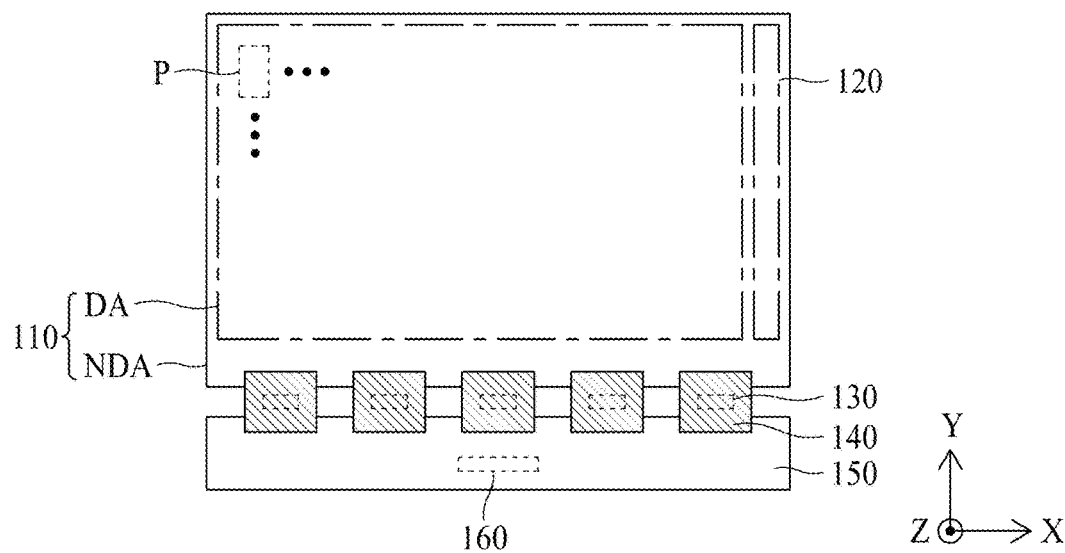
FIG. 3 is a plan view illustrating further details of the organic light emitting display device of FIG. 2.

FIG. 2 is a perspective view illustrating an organic light emitting display device 100 according to an embodiment of the present disclosure. FIG. 3 is a plan view illustrating further details of the organic light emitting display device 100 of FIG. 2, such as a first substrate, a gate driver, a source drive integrated circuit (IC), a flexible film, a circuit board, and a timing controller.

Referring to FIGS. 2 and 3, the organic light emitting display device 100 according to an embodiment of the present disclosure may include a display panel 110, a gate driver 120, a source drive IC 130, a flexible film 140, a circuit board 150, and a timing controller 160.

The display panel 110 may include a first substrate 111 and a second substrate 112. The second substrate 112 may be an encapsulation substrate. The first substrate 111 may be a plastic film, a glass substrate, or the like. The second substrate 112 may be a plastic film, a glass substrate, an encapsulation film (a protective film), or the like.

A plurality of gate lines, a plurality of data lines, and a plurality of pixels P may be provided on a surface of the first substrate 111 that faces the second substrate 112. The pixels may be respectively provided in a plurality of areas defined by an intersection structure of the gate lines and the data lines.

Each of the pixels may include a thin film transistor (TFT) and an organic light emitting device which includes a first electrode, an organic light emitting layer, and a second electrode. When a gate signal is input through a gate line, each of the pixels may supply a certain current to the organic light emitting device by using the TFT according to a data voltage supplied through a data line. Therefore, the organic light emitting device of each of the pixels may emit light having a certain brightness according to the certain current. Various embodiments of pixels will be described in further detail herein.

The display panel 110, as illustrated in FIG. 3, may be divided into a display area DA, where the pixels are provided to display an image, and a non-display area NDA which does not display an image. The gate lines, the data lines, and the pixels may be provided in the display area DA. The gate driver 120 and a plurality of pads may be provided in the non-display area NDA.

The gate driver 120 may sequentially supply gate signals to the gate lines according to a gate control signal input from the timing controller 160. The gate driver 120 may be provided in the non-display area NDA outside one side or both sides of the display area DA of the display panel 110 in a gate driver-in panel (GIP) type. Alternatively, the gate driver 120 may be manufactured as a driving chip and may be mounted on a flexible film, and moreover, may be attached on the non-display area NDA outside the one side or the both sides of the display area DA of the display panel 110 in a tape automated bonding (TAB) type.

The source drive IC 130 may receive digital video data and a source control signal from the timing controller 160. The source drive IC 130 may convert the digital video data into analog data voltages according to the source control signal and may respectively supply the analog data voltages to the data lines. If the source drive IC 130 is manufactured as a driving chip, the source drive IC 130 may be mounted on the flexible film 140 in a chip-on film (COF) type or a chip-on plastic (COP) type.

A plurality of pads such as data pads may be provided in the non-display area NDA of the display panel 110. Lines connecting the pads to the source drive IC 130 and lines connecting the pads to lines of the circuit board 150 may be provided on the flexible film 140. The flexible film 140 may be attached on the pads by an anisotropic conductive film, and thus, the pads may be connected to the lines of the flexible film 140.

The circuit board 150 may be attached on the flexible film 140, which may be provided as a plurality of flexible films 140, as shown. A plurality of circuits implemented as driving chips may be mounted on the circuit board 150. For example, the timing controller 160 may be mounted on the circuit board 150. The circuit board 150 may be a printed circuit board (PCB) or a flexible printed circuit board (FPCB).

The timing controller 160 may receive the digital video data and a timing signal from an external system board (not shown) through a cable of the circuit board 150. The timing controller 160 may generate a gate control signal for controlling an operation timing of the gate driver 120 and a source control signal for controlling the source drive IC 130, which may be provided as a plurality of source drive ICs 130, based on the timing signal. The timing controller 160 may supply the gate control signal to the gate driver 120 and may supply the source control signal to the plurality of source drive ICs 130.

Figure 4:
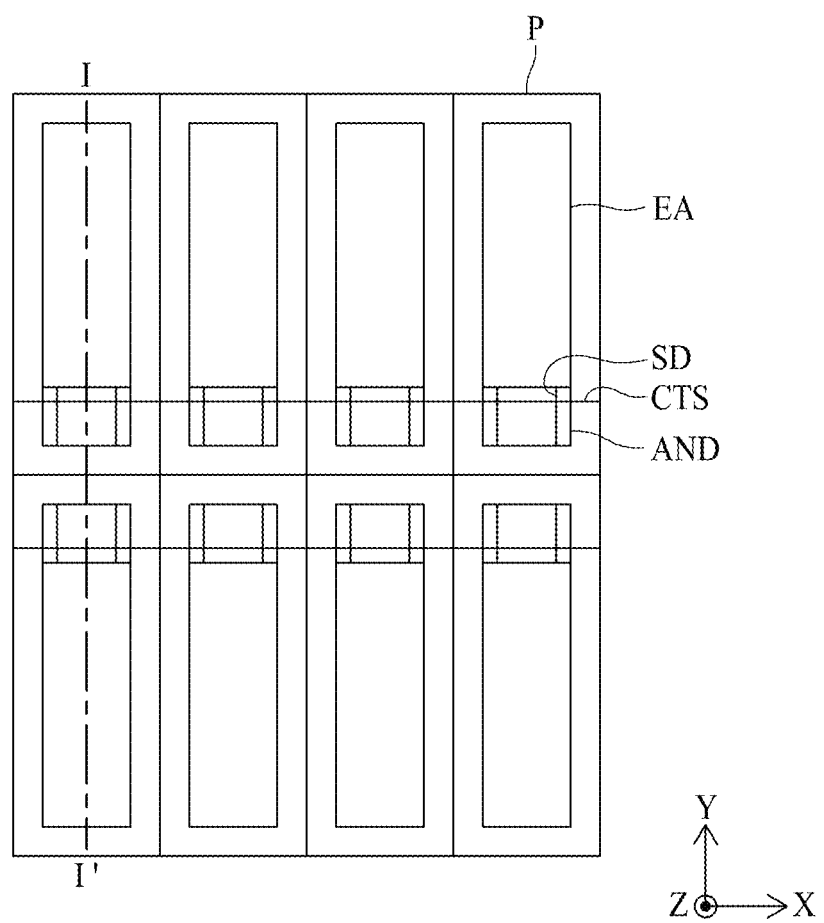
FIG. 4 is a plan view illustrating in detail an example of pixels in a display area, in accordance with one or more embodiments of the present disclosure.

FIG. 4 is a plan view illustrating in detail an example of pixels in a display area.

In FIG. 4, for convenience of description, only a pixel P, an emissive area EA, a first electrode AND of an organic light emitting device, a drain electrode SD of a transistor, and a shared contact hole CTS are illustrated.

Referring to FIG. 4, a plurality of pixels P may be provided, and each of the pixels P may include at least one TFT and an organic light emitting device.

The TFT may include an active layer, a gate electrode overlapping the active layer, a source electrode connected to one side of the active layer, and a drain electrode connected to the other side of the active layer. The active layer may include a source region, a drain region and a channel region between the source region and the drain region. The source electrode may thus be connected to the source region of the active layer, and the drain electrode may be connected to the drain region of the active layer. The TFT may be replaced with another kind of suitable transistor.

The organic light emitting device may include the first electrode AND corresponding to an anode electrode, an organic light emitting layer, and a second electrode corresponding to a cathode electrode. The emissive area EA may denote an area where the first electrode AND, the organic light emitting layer, and the second electrode are sequentially stacked, and a hole from the first electrode AND and an electron from the second electrode are combined in the organic light emitting layer to emit light. The emissive area EA of adjacent pixels P may be separated by a bank, and thus, the bank may correspond to a non-emissive area that does not emit light.

N (where N is an integer equal to or more than two) number of pixels P, as in FIG. 4, may share the shared contact hole CTS. The shared contact hole CTS may be a hole that is formed for connecting the drain electrode SD of the TFT of each of the N pixels P to the first electrode AND of the organic light emitting device. The drain electrode SD of each of the TFTs of the N pixels P may be exposed through the shared contact hole CTS. Therefore, the first electrode AND of the organic light emitting device of each of the N pixels P may be connected to the drain electrode SD of the TFT by the shared contact hole CTS.

Moreover, the first electrode AND of the organic light emitting device and the drain electrode SD of the TFT may be formed by simultaneous etching. In this case, an end of the first electrode AND of the organic light emitting device may match with a corresponding end of the drain electrode SD of the TFT in the shared contact hole CTS.

Moreover, drain electrodes SD of TFTs of pixels P which are adjacent to each other in a first direction (e.g., a Y axis direction) may be disposed to face each other. Therefore, the drain electrodes SD of the TFTs of the pixels P which are adjacent to each other in the first direction (e.g., the Y axis direction) may be exposed by one shared contact hole CTS. Accordingly, the pixels P which are adjacent to each other in the first direction (e.g., the Y axis direction) may share the shared contact hole CTS for connecting the first electrode of the organic light emitting device to the drain electrode of the TFT.

Moreover, the shared contact hole CTS may be formed with a long axis that extends in a second direction (e.g., an X axis direction) intersecting the first direction (e.g., the Y axis direction). The first direction (e.g., the Y axis direction) may be a direction that is parallel to data lines in the organic light emitting display device, and the second direction (e.g., the X axis direction) may be a direction that is parallel to gate lines in the organic light emitting display device. That is, the shared contact hole CTS may be formed to extend in a direction that is parallel with the gate lines. Therefore, the drain electrodes SD of the TFTs of the pixels P which are adjacent to each other in the first direction (e.g., the Y axis direction) may be exposed by one shared contact hole CTS. Accordingly, N number of pixels P may share the shared contact hole CTS for connecting the first electrode of the organic light emitting device to the drain electrode of the TFT.

Figure 5:
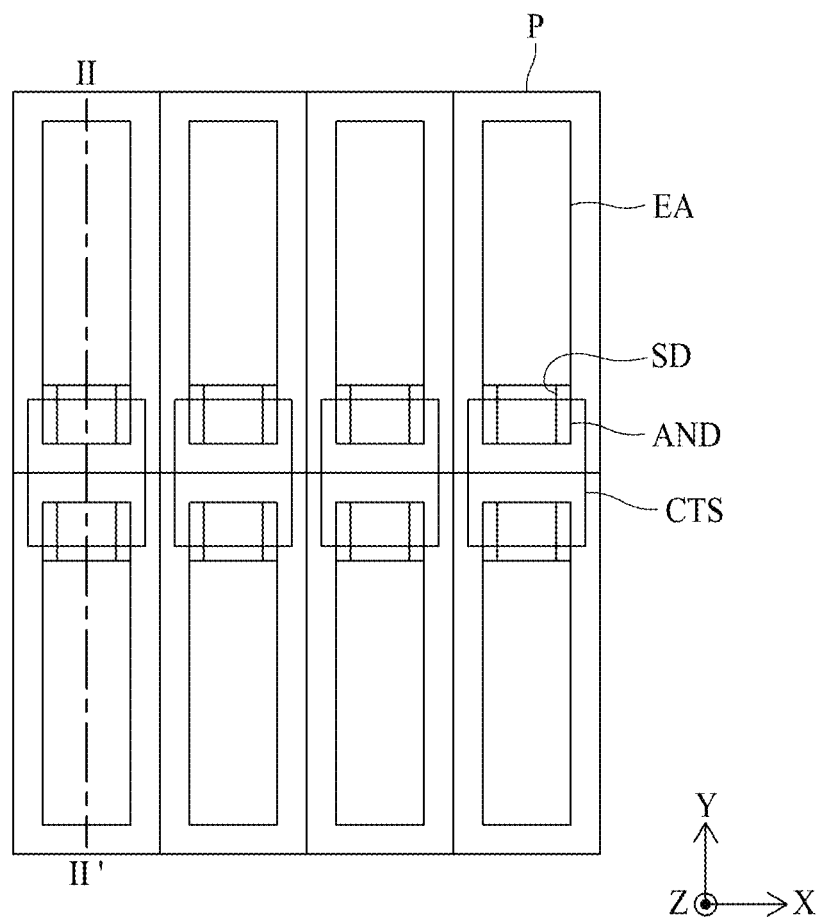
FIG. 5 is a plan view illustrating in detail another example of pixels in a display area, in accordance with one or more embodiments of the present disclosure.
Figure 6:
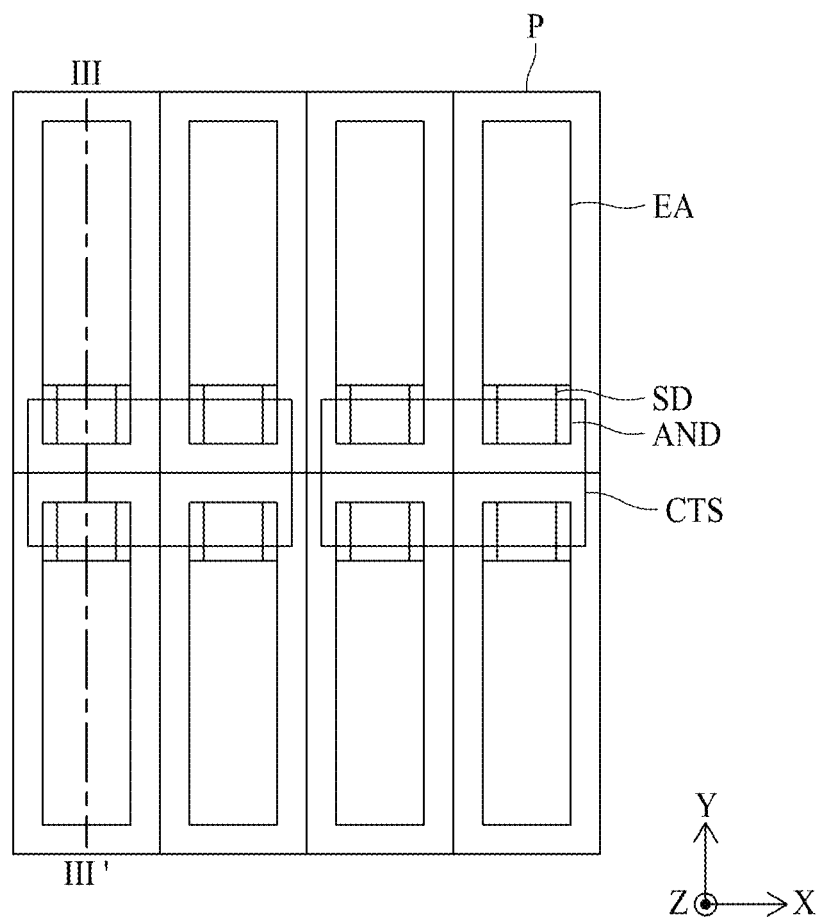
FIG. 6 is a plan view illustrating in detail another example of pixels in a display area, in accordance with one or more embodiments of the present disclosure.

In FIG. 4, N is illustrated as eight (N=8), but the present embodiments are not limited thereto. For example, as shown in FIG. 5, N may be two (N=2), and as shown in FIG. 6, N may be four (N=4). As in FIG. 5, when N=2, two pixels P which are adjacent to each other in the first direction (e.g., the Y axis direction) may share the shared contact hole CTS. Also, as in FIG. 6, when N=4, four pixels P which are adjacent to each other in the first direction (e.g., respective pairs being adjacent in the Y axis direction) and the second direction (e.g., respective pairs being adjacent in the X axis direction) may share the shared contact hole CTS. In embodiments of the present disclosure, the number of pixels P sharing the shared contact hole CTS is not limited to the examples illustrated herein, for example, in FIGS. 4 to 6.

As described above, in an embodiment of the present disclosure, the N pixels P may share the shared contact hole CTS for connecting the first electrode of the organic light emitting device to the drain electrode of the TFT. Accordingly, in an embodiment of the present disclosure, the emissive area EA is prevented from being reduced by the shared contact hole CTS, thereby preventing a lifetime of the organic light emitting layer from being shortened due to the reduction in the emissive area EA.

In FIG. 4, the first electrode AND of each of the pixels P is illustrated as being connected to a drain electrode SD of a TFT, but the present embodiments are not limited thereto. In other embodiments, the first electrode AND of each of the pixels P may be connected to a source electrode. In such a case, source electrodes of TFTs of pixels P which are adjacent to each other in the first direction (e.g., the Y axis direction) may be disposed to face each other in the shared contact hole CTS.

Figure 7:
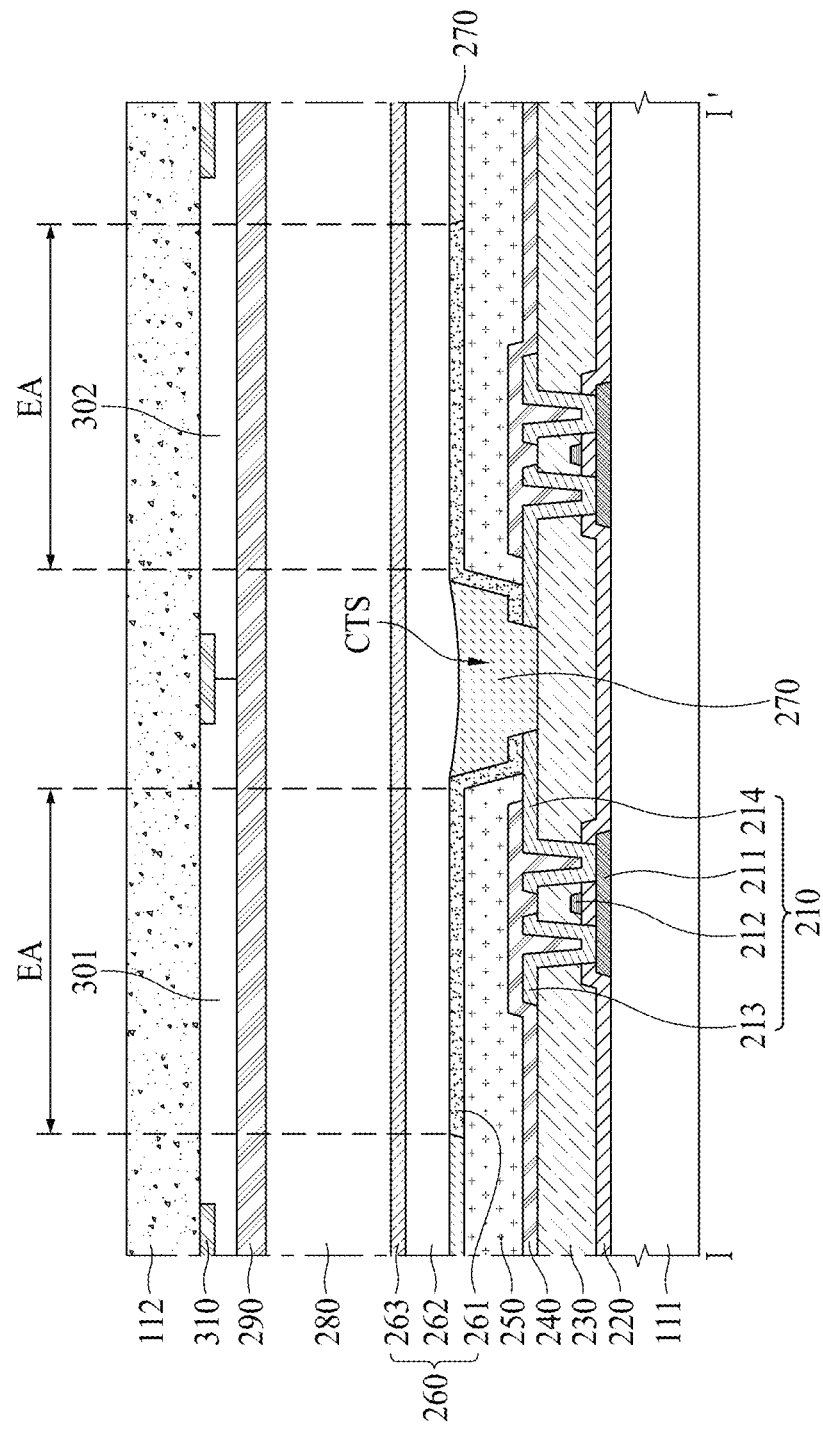
FIG. 7 is a cross-sectional view taken along line I-I' of FIG. 4.

FIG. 7 is a cross-sectional view illustrating an example taken along line I-I' of FIG. 4.

Referring to FIG. 7, a buffer layer (not shown) may be formed on one surface of the first substrate 111 that faces the second substrate 112. The buffer layer may be formed on the surface of the first substrate 111, for protecting a plurality of TFTs 210 and a plurality of organic light emitting devices 260 from water which penetrates through the first substrate 111, which may be vulnerable to penetration of water. The buffer layer may include a plurality of inorganic layers which are alternately stacked. For example, the buffer layer may be formed of a multilayer where one or more inorganic layers of silicon oxide (SiOx), silicon nitride (SiNx), and SiON are alternately stacked. The buffer layer may be omitted in various embodiments.

The TFTs 210 may be formed on the buffer layer. In FIG. 7, a first electrode 261 of each of the pixels P is illustrated as being connected to a drain electrode 214 of at least one TFT, but the first electrode 261 may be connected to the source electrode 213 without being limited thereto.

Each of the TFTs 210 may include an active layer 211, a gate electrode 212, a source electrode 213, and a drain electrode 214. In FIG. 7, the TFTs 210 are exemplarily illustrated as being formed in a top gate type where the gate electrode 212 is disposed on the active layer 211, but embodiments provided herein are not limited thereto. In other embodiments, the TFTs 210 may be formed in a bottom gate type where the gate electrode 212 is disposed under the active layer 211 or a double gate type where the gate electrode 212 is disposed both on and under the active layer 211.

The active layer 211 may be formed on the buffer layer. The active layer 211 may be formed of any semiconductor material, including a silicon-based semiconductor material or an oxide-based semiconductor material. A light blocking layer (not shown) for blocking external light incident on the active layer 211 may be formed between the buffer layer and the active layer 211.

A gate insulation layer 220 may be formed on the active layer 211. The gate insulation layer 220 may be formed of an inorganic layer, for example, silicon oxide (SiOx), silicon nitride (SiNx), or a multilayer thereof.

The gate electrode 212 and a gate line may be formed on the gate insulation layer 220. The gate electrode 212 and the gate line may each be formed of a single layer or a multilayer which may include one of molybdenum (Mo), chromium (Cr), titanium (Ti), nickel (Ni), neodymium (Nd), and copper (Cu), or an alloy thereof. The gate electrode 212 may be connected to the gate line, such that the gate electrode 212 receives a signal provided on the gate line.

An interlayer dielectric 230 may be formed on the gate electrode 212 and the gate line. The interlayer dielectric 230 may be formed of an inorganic layer, for example, SiOx, SiNx, or a multilayer thereof.

The source electrode 213, the drain electrode 214, and a data line may be formed on the interlayer dielectric 230. The source electrode 213 may contact the active layer 211 through a source contact hole which passes through the gate insulation layer 220 and the interlayer dielectric 230. The drain electrode 214 may contact the active layer 211 through a drain contact hole which passes through the gate insulation layer 220 and the interlayer dielectric 230. The source electrode 213, the drain electrode 214, and the data line may each be formed of a single layer or a multilayer which includes one of Mo, Cr, Ti, Ni, Nd, and Cu, or an alloy thereof. The data line may be connected to source electrode 213, such that a driving signal provided on the data line may be provided to the drain electrode 214 when the TFT is turned on by a gate signal provided at the gate electrode 212.

A passivation layer 240 for insulating the TFTs 210 may be formed on the source electrode 213, the drain electrode 214, and the data line. The passivation layer 240 may be formed of an inorganic layer, for example, SiOx, SiNx, or a multilayer thereof.

A first planarization layer 250 for planarizing a step height caused by the TFTs 210 may be formed on the passivation layer 240. The first planarization layer 250 may be formed of an organic layer such as acryl resin, epoxy resin, phenolic resin, polyamide resin, polyimide resin, or the like.

An organic light emitting device 260 and portions of a bank 270 may be formed on the first planarization layer 250. The organic light emitting device 260 may include a first electrode 261, an organic light emitting layer 262, and a second electrode 263. The first electrode 261 may be an anode electrode, and the second electrode 263 may be a cathode electrode.

The first electrode 261 may be formed on the first planarization layer 250. The first electrode 261 may be connected to the drain electrode 214 of the TFT 210 through the shared contact hole CTS which passes through the first planarization layer 250 to expose an edge of the drain electrode 214 of the TFT 210.

The first electrode 261 and the drain electrode 214 may be formed by simultaneous etching. In this case, as shown in FIG. 7, one end portion of the first electrode 261 may match a corresponding end portion of the drain electrode 214 in the shared contact hole CTS. That is, as shown in FIG. 7, an end portion of the drain electrode 214 extends into the shared contact hole CTS and is covered by a corresponding end portion of the first electrode 261 in the shared contact hole CTS. Also, the drain electrodes 214 of the TFTs 210 of adjacent pixels P may be formed to face each other in the shared contact hole CTS. For example, as shown in FIG. 7, a drain electrode 214 of a TFT 210 shown in FIG. 7 on the left side of the shared contact hole CTS is aligned with, and faces, a drain electrode of a TFT on the right side of the shared contact hole CTS. Therefore, the first electrode 261 may be disconnected from another first electrode 261 adjacent thereto across the shared contact hole CTS.

The first electrode 261 may be formed of aluminum (Al), silver (Ag), molybdenum (Mo), a stacked structure (Mo/Ti) of Mo and titanium (Ti), copper (Cu), a stacked structure of Al and Ti, a stacked structure (ITO/Al/ITO) of Al and indium tin oxide (ITO), an APC alloy, or a stacked structure (ITO/APC/ITO) of an APC alloy and ITO. The APC alloy may be an alloy of Ag, palladium (Pd), and Cu.

The bank 270 may be formed to fill the shared contact hole CTS. Also, a plurality of emissive areas EA may be divided by the bank 270. That is, the bank 270 may define the emissive areas EA.

Each of the emissive areas EA may denote an area where the first electrode 261 corresponding to an anode electrode, the organic light emitting layer 262, and the second electrode 263 corresponding to a cathode electrode are sequentially stacked, and a hole from the first electrode 261 and an electron from the second electrode 263 are combined in the organic light emitting layer to emit light. In this case, an area where the bank 270 is provided does not emit light, and thus, may be defined as a non-emissive area.

The bank 270 may be formed of an organic layer such as acryl resin, epoxy resin, phenolic resin, polyamide resin, polyimide resin, or the like.

The organic light emitting layer 262 may be formed on the first electrode 261 and the bank 270. The organic light emitting layer 262 may be a common layer which is formed in each of the pixels P in common, and may be a white light emitting layer that emits white light. In this case, the organic light emitting layer 262 may be formed in a tandem structure of two or more stacks. Each of the stacks may include a hole transporting layer, at least one light emitting layer, and an electron transporting layer.

The hole transporting layer may smoothly transfer a hole, injected from the first electrode 261 or a charge generating layer, to the organic light emitting layer 262. The organic light emitting layer 262 may be formed of an organic material including a phosphorescent material or a fluorescent material, and thus, may emit certain light. The electron transporting layer may smoothly transfer an electron, injected from the second electrode 263 or the charge generating layer, to the organic light emitting layer 262.

The charge generating layer may include an n-type charge generating layer, disposed adjacent to a lower stack, and a p-type charge generating layer which is formed on the n-type charge generating layer and is disposed adjacent to an upper stack. The n-type charge generating layer may inject an electron into the lower stack, and the p-type charge generating layer may inject a hole into the upper stack. The n-type charge generating layer may be formed of an organic layer which is doped with an alkali metal, such as lithium (Li), sodium (Na), potassium (K), or cesium (Cs), or an alkali earth metal such as magnesium (Mg), strontium (Sr), barium (Ba), or radium (Ra). The p-type charge generating layer may be an organic layer which is formed by doping an organic host material with a dopant having an ability to transport holes.

In FIG. 7, it is illustrated that the organic light emitting layer 262 is a common layer which is formed in each of the pixels P in common and is the white light emitting layer emitting the white light, but the present embodiments are not limited thereto. In other embodiments, the organic light emitting layer 262 may be individually provided in each of the pixels P, and in this case, the pixels P may be divided into red pixels including a red light emitting layer emitting red light, green pixels including a green light emitting layer emitting green light, and blue pixels including a blue light emitting layer emitting blue light.

The second electrode 263 may be formed on the organic light emitting layer 262. The second electrode 263 may be a common layer which is formed in each of the pixels P in common. The second electrode 263 may be formed of a transparent conductive material (or TCO), such as indium tin oxide (ITO) or indium zinc oxide (IZO) capable of transmitting light, or a semi-transmissive conductive material such as Mg, Ag, or an alloy of Mg and Ag. In a case where the second electrode 263 is formed of the semi-transmissive conductive material, emission efficiency may be enhanced by a micro-cavity. A capping layer may be formed on the second electrode 263.

An encapsulation layer 280 may be formed on the second electrode 263. The encapsulation layer 280 prevents oxygen or water from penetrating into the organic light emitting layer 262 and the second electrode 263. The encapsulation layer 280 may include at least one inorganic layer. The inorganic layer may be formed of silicon nitride, aluminum nitride, zirconium nitride, titanium nitride, hafnium nitride, tantalum nitride, silicon oxide, aluminum oxide, titanium oxide, or the like. Also, the encapsulation layer 280 may further include at least one organic layer, for preventing particles from penetrating into the organic light emitting layer 262 and the second electrode 263 via the encapsulation layer 280.

A plurality of color filters 301 and 302 and a black matrix 310 may be disposed on the second substrate 112 and positioned between the second substrate 112 and the encapsulation layer 280. The color filters 301 and 302 may be respectively disposed in correspondence with the pixels P. The black matrix 310 may be disposed between and partially overlapping the adjacent color filters 301 and 302 and may be disposed in correspondence with the bank 270.

The color filters 301 and 302 on the second substrate 112 may be adhered to the encapsulation layer 280 on the first substrate 111 by an adhesive layer 290. Therefore, the first substrate 111 and the structures formed thereon may be bonded to the second substrate 112 and the structures formed thereon. The adhesive layer 290 may be a transparent adhesive film, a transparent adhesive resin, or the like. The second substrate 112 may be a plastic film, a glass substrate, an encapsulation film (a protective film), or the like.

As described above, in an embodiment of the present disclosure, since the first electrode 261 and the drain electrode 214 are formed by simultaneous etching, an end portion of the first electrode 261 may match a corresponding end portion of the drain electrode 214 in the shared contact hole CTS, and the drain electrodes 214 of the TFTs 210 of adjacent pixels P may be formed to face each other in the shared contact hole CTS. Therefore, in an embodiment of the present disclosure, the first electrode 261 may not be connected to another first electrode 261 adjacent thereto in the shared contact hole CTS. Accordingly, in an embodiment of the present disclosure, since adjacent pixels P share the shared contact hole CTS, the emissive area EA is prevented from being reduced by the shared contact hole CTS, thereby preventing a lifetime of the organic light emitting layer from being shortened due to the reduction in the emissive area EA.

A cross-sectional view taken along line II-II' in FIG. 5 and a cross-sectional view taken along line III-III' in FIG. 6 are substantially the same as the cross-sectional view taken along line I-I' in FIG. 4, and thus, their detailed descriptions are omitted.

Figure 8:
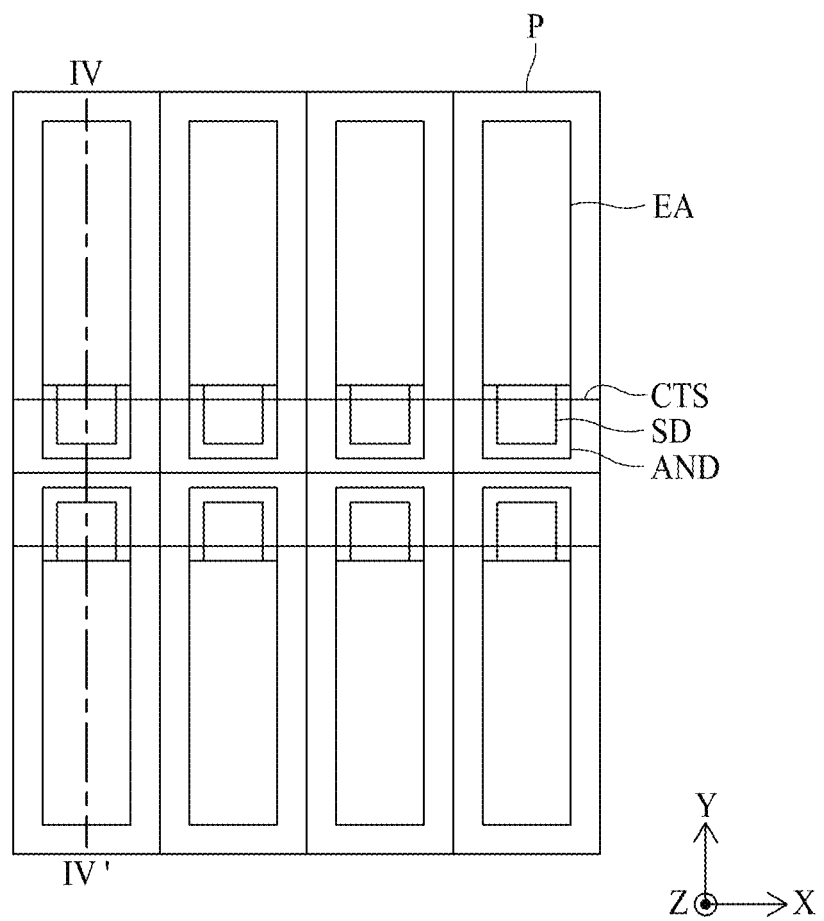
FIG. 8 is a plan view illustrating in detail another example of pixels in a display area, in accordance with one or more embodiments of the present disclosure.

FIG. 8 is a plan view illustrating in detail another example of pixels in a display area.

In FIG. 8, for convenience of description, only a pixel P, an emissive area EA, a first electrode AND of an organic light emitting device, a drain electrode SD of a transistor, and a shared contact hole CTS are illustrated.

Except for a first electrode AND of an organic light emitting device, the plan view illustrated in FIG. 8 is substantially as described above with reference to FIG. 4. Thus, detailed descriptions of the pixel P, the emissive area EA, the drain electrode SD of the transistor, and the shared contact hole CTS of FIG. 8 are omitted.

Referring to FIG. 8, the first electrode AND of the organic light emitting device of each of N number of pixels P may be connected to a drain electrode SD of a TFT by the shared contact hole CTS.

Moreover, as in FIG. 8, one end of the first electrode AND of the organic light emitting device may extend longer than one end of the drain electrode SD of the TFT, in the shared contact hole CTS. That is, the first electrode AND of the organic light emitting device may be formed to fully cover the drain electrode SD of the TFT.

In FIG. 8, N is illustrated as eight (N=8), but the present embodiments are not limited thereto. For example, as shown in FIG. 5, N may be two (N=2), and as shown in FIG. 6, N may be four (N=4). As in FIG. 5, when N=2, two pixels P which are adjacent to each other in the first direction (e.g., the Y axis direction) may share the shared contact hole CTS. Also, as in FIG. 6, when N=4, four pixels P which are adjacent to each other in the first direction (e.g., respective pairs being adjacent in the Y axis direction) and the second direction (e.g., respective pairs being adjacent in the X axis direction) may share the shared contact hole CTS. In embodiments of the present disclosure, the number of pixels P sharing the shared contact hole CTS is not limited to the examples illustrated in FIGS. 4 to 6.

Figure 9:
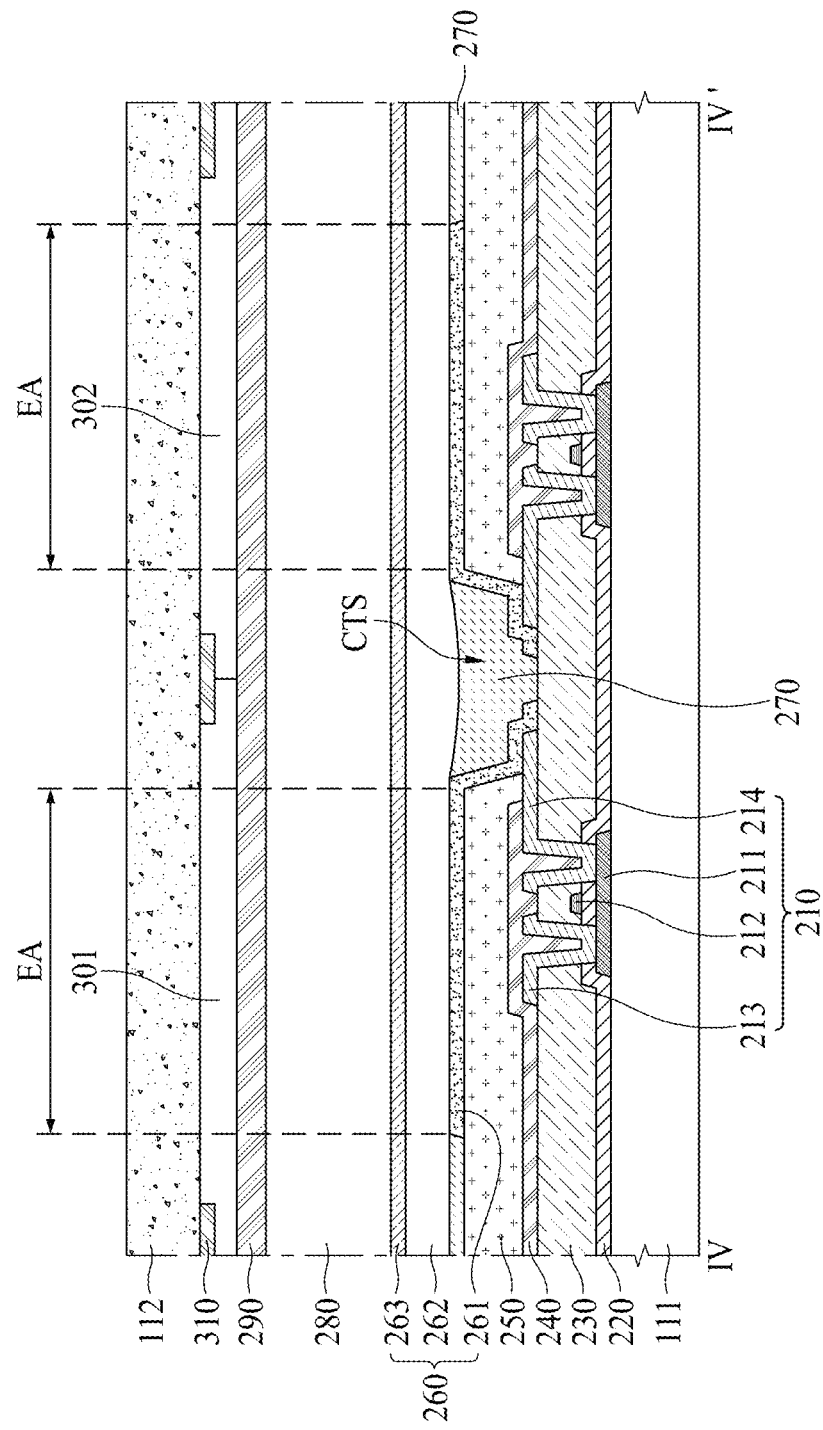
FIG. 9 is a cross-sectional view taken along line IV-IV' of FIG. 8.

FIG. 9 is a cross-sectional view illustrating an example taken along line IV-IV' of FIG. 8.

Except for a connection structure of the first electrode 261 of the organic light emitting device 260 and the drain electrode 214 of the TFT 210, the cross-sectional view illustrated in FIG. 9 is substantially as described above with reference to FIG. 7. Therefore, detailed descriptions of first and second substrates 111 and 112, an active layer 211, a gate electrode 212, a source electrode 213, and a drain electrode 214 of a TFT 210, a gate insulation layer 220, an interlayer dielectric 230, a passivation layer 240, a first planarization layer 250, an organic light emitting layer 262, a second electrode 263, an encapsulation layer 280, an adhesive layer 290, color filters 301 and 302, and a black matrix 310 illustrated in FIG. 9 are omitted.

Referring to FIG. 9, the first electrode 261 may be formed on the first planarization layer 250. The first electrode 261 may be connected to the drain electrode 214 of the TFT 210 through a shared contact hole CTS which passes through the first planarization layer 250 to expose an edge of the drain electrode 214 of the TFT 210.

In contrast to the embodiment shown in FIG. 7, in which the drain electrode 214 and the first electrode 261 are simultaneously etched, the drain electrode 214 and the first electrode 261 of the embodiment shown in FIG. 9 are not simultaneously etched. Accordingly, an end portion of the first electrode 261 of the organic light emitting device 260 may be formed to extend longer into the shared contact hole CTS than an end portion of the drain electrode 214 of the TFT 210. That is, as shown in FIG. 9, the end portion of the first electrode 261 may extend further toward a center of the shared contact hole CTS than does the drain electrode 214, such that the first electrode 261 covers the upper surface and a side surface of the drain electrode 214 in the shared contact hole CTS. In this case, the first electrode 261 of the organic light emitting device 260 may be formed to fully cover the drain electrode 214 of the TFT 210. As shown in FIG. 9, at least some of the end portion of the first electrode 261 may contact a floor of the shared contact hole CTS, such that it is disposed on a surface of the interlayer dielectric 230 in the shared contact hole CTS. Alternatively, if the drain electrode 214 and the first electrode 261 are not simultaneously etched, the end portion of the drain electrode 214 of the TFT 210 may extend longer than the end portion of the first electrode 261 of the organic light emitting device 260, in the shared contact hole CTS. In this case, the first electrode 261 of the organic light emitting device 260 may be formed to cover a portion of the drain electrode 214 of the TFT 210. Also, the drain electrodes 214 of the TFTs 210 of adjacent pixels P may be formed to face each other in the shared contact hole CTS. Therefore, the first electrode 261 may be disconnected from another first electrode 261 adjacent thereto in the shared contact hole CTS.

The first electrode 261 may be formed of aluminum (Al), silver (Ag), molybdenum (Mo), a stacked structure (Mo/Ti) of Mo and titanium (Ti), copper (Cu), a stacked structure of Al and Ti, a stacked structure (ITO/Al/ITO) of Al and indium tin oxide (ITO), an APC alloy, or a stacked structure (ITO/APC/ITO) of an APC alloy and ITO. The APC alloy may be an alloy of Ag, palladium (Pd), and Cu.

As described above, in an embodiment of the present disclosure, the first electrode 261 may not be connected to another first electrode 261 adjacent thereto in the shared contact hole CTS. Accordingly, in an embodiment of the present disclosure, since adjacent pixels P share the shared contact hole CTS, the emissive area EA is prevented from being reduced by the shared contact hole CTS, thereby preventing a lifetime of the organic light emitting layer from being shortened due to the reduction in the emissive area EA.

Figure 10:
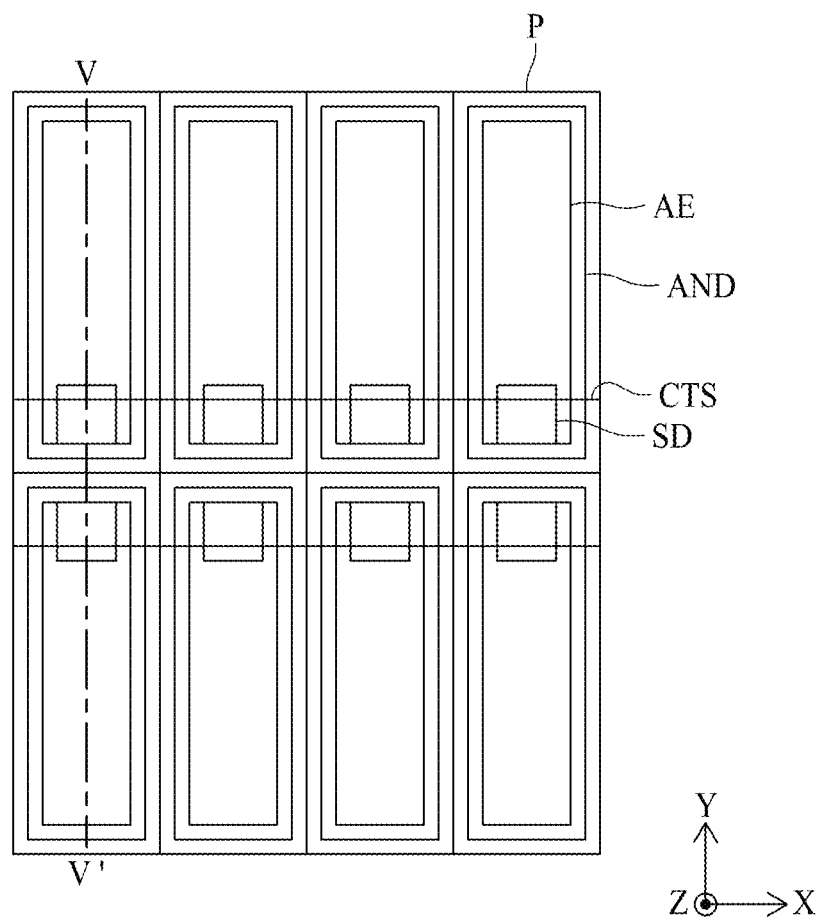
FIG. 10 is a plan view illustrating in detail another example of pixels in a display area, in accordance with one or more embodiments of the present disclosure.

FIG. 10 is a plan view illustrating in detail another example of pixels in a display area.

In FIG. 10, for convenience of description, only a pixel P, an auxiliary electrode AE, a first electrode AND of an organic light emitting device, a drain electrode SD of a transistor, and a shared contact hole CTS are illustrated.

Referring to FIG. 10, a plurality of pixels P may be provided, and each of the pixels P may include at least one TFT and an organic light emitting device.

The TFT may include an active layer, a gate electrode overlapping the active layer, a source electrode connected to one side of the active layer, and a drain electrode connected to the other side of the active layer. The TFT may be replaced with another kind of suitable transistor in various embodiments.

The organic light emitting device may include the first electrode AND corresponding to an anode electrode, an organic light emitting layer, and a second electrode corresponding to a cathode electrode. The emissive area EA may denote an area where the first electrode AND, the organic light emitting layer, and the second electrode are sequentially stacked, and a hole from the first electrode AND and an electron from the second electrode are combined in the organic light emitting layer to emit light. The emissive area EA of adjacent pixels P may be separated by a bank, and thus, the bank may correspond to a non-emissive area that does not emit light.

N (where N is an integer equal to or more than two) number of pixels P, as in FIG. 10, may share the shared contact hole CTS. The shared contact hole CTS may be a hole that is formed for connecting the drain electrode SD of the TFT of each of the N pixels P to the first electrode AND of the organic light emitting device via the auxiliary electrode AE. The drain electrode SD of each of the TFTs of the N pixels P may be connected to an auxiliary electrode AE in the shared contact hole CTS, and the auxiliary electrode AE may be connected to first electrode AND.

The auxiliary electrode AE may be connected to the first electrode AND of the organic light emitting device. The auxiliary electrode AE of each of N number of pixels may be connected to the drain electrode SD of the TFT by the shared contact hole CTS.

The auxiliary electrode AE and the drain electrode SD of the TFT may be formed by simultaneous etching. In this case, an end portion of the auxiliary electrode AE may match with a corresponding end portion of the drain electrode SD of the TFT in the shared contact hole CTS. Alternatively, an end portion of the auxiliary electrode AE may extend longer into the shared contact hole CTS than an end portion of the drain electrode SD of the TFT. That is, the auxiliary electrode AE may be formed to fully cover the end portion of the drain electrode SD of the TFT in the shared contact hole CTS. Alternatively, the end portion of the drain electrode SD of the TFT may extend longer into the shared contact hole CTS than the end portion of the auxiliary electrode AE. That is, the auxiliary electrode AE may be formed to cover only a portion of the drain electrode SD of the TFT in the shared contact hole CTS.

Moreover, pixels P, which are adjacent to each other in a first direction (e.g., a Y axis direction), of the N pixels P may share the shared contact hole CTS. To this end, drain electrodes SD of TFTs of pixels P which are adjacent to each other in the first direction (e.g., the Y axis direction) may be disposed to face each other in the shared contact hole CTS.

Moreover, the shared contact hole CTS may be formed with a long axis that extends in a second direction (e.g., an X axis direction) intersecting the first direction (e.g., the Y axis direction). The first direction (e.g., the Y axis direction) may be a direction that is parallel to data lines in the organic light emitting display device, and the second direction (e.g., the X axis direction) may be a direction that is parallel to gate lines in the organic light emitting display device. In this case, the shared contact hole CTS may be formed to extend in a direction that is parallel with the gate lines.

In FIG. 10, N is illustrated as eight (N=8), but the present embodiments are not limited thereto. For example, as shown in FIG. 5, N may be two (N=2), and as shown in FIG. 6, N may be four (N=4). As in FIG. 5, when N=2, two pixels P which are adjacent to each other in the first direction (e.g., the Y axis direction) may share the shared contact hole CTS. Also, as in FIG. 6, when N=4, four pixels P which are adjacent to each other in the first direction (e.g., respective pairs being adjacent in the Y axis direction) and the second direction (e.g., respective pairs being adjacent in the X axis direction) may share the shared contact hole CTS. In embodiments of the present disclosure, the number of pixels P sharing the shared contact hole CTS is not limited to the examples illustrated in FIGS. 4 to 6.

As described above, in an embodiment of the present disclosure, the N pixels P may share the shared contact hole CTS for connecting the auxiliary electrode to the drain electrode of the TFT. Accordingly, in an embodiment of the present disclosure, the emissive area EA is prevented from being reduced by the shared contact hole CTS, thereby preventing a lifetime of the organic light emitting layer from being shortened due to the reduction in the emissive area EA.

Figure 11:
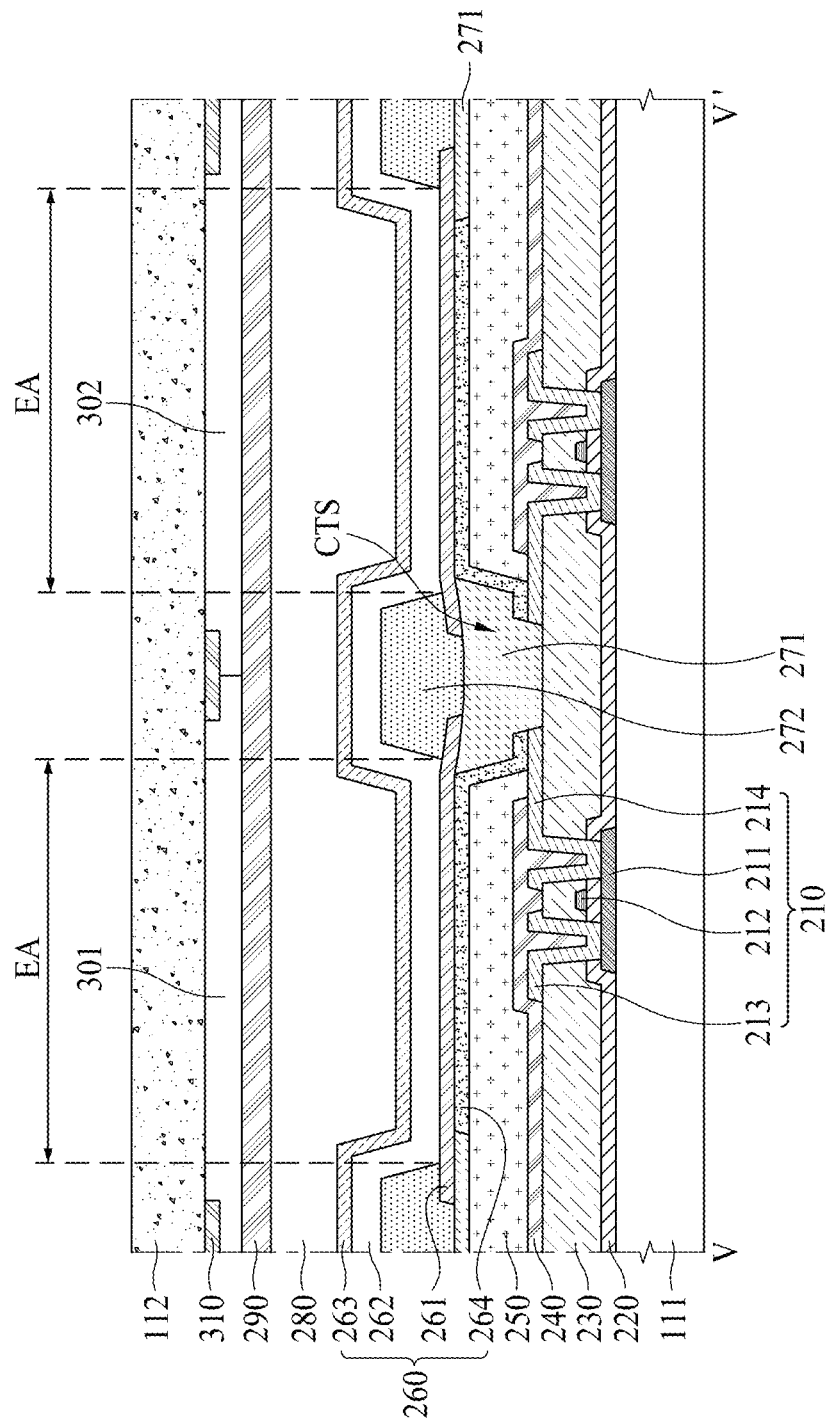
FIG. 11 is a cross-sectional view illustrating an example taken along line V-V' of FIG. 10.

FIG. 11 is a cross-sectional view illustrating an example taken along line V-V' of FIG. 10.

Except that an auxiliary electrode 264 and a second planarization layer 271 are further provided and positions of the first electrode 261 and the bank 272 are changed, the cross-sectional view illustrated in FIG. 11 is substantially as described above with reference to FIG. 7. Therefore, detailed descriptions of first and second substrates 111 and 112, an active layer 211, a gate electrode 212, a source electrode 213, and a drain electrode 214 of a TFT 210, a gate insulation layer 220, an interlayer dielectric 230, a passivation layer 240, a first planarization layer 250, an organic light emitting layer 262, a second electrode 263, an encapsulation layer 280, an adhesive layer 290, color filters 301 and 302, and a black matrix 310 illustrated in FIG. 11 are omitted. Moreover, it is noted that the second planarization layer 271 illustrated in FIG. 11 substantially corresponds to the bank 270 illustrated in FIG. 7. However, as illustrated in FIG. 11, a bank 272 is formed over the second planarization layer 271, and it is the bank 272 that divides the emissive area EA of adjacent pixels P, and thus corresponds to a non-emissive area that does not emit light. Accordingly, the bank 272 is referred to as a "bank" in the description of FIG. 11, while the layer 271, which does not define the non-emissive area, is referred to instead as a second planarization layer 271.

Referring to FIG. 11, the auxiliary electrode 264 may be connected to the drain electrode 214 of the TFT 210 through a shared contact hole CTS which passes through the first planarization layer 250 to expose an edge of the drain electrode 214 of the TFT 210.

The auxiliary electrode 264 and the drain electrode 214 may be formed by simultaneous etching. In this case, as shown in FIG. 11, an end portion of the auxiliary electrode 264 may match a corresponding end portion of the drain electrode 214 of the TFT 210 in the shared contact hole CTS. Alternatively, the end portion of the auxiliary electrode 264 may extend longer into the shared contact hole CTS than the end portion of the drain electrode 214 of the TFT 210. In this case, the auxiliary electrode 264 may be formed to fully cover the drain electrode 214 of the TFT 210, and may extend past the edge of the drain electrode 214 such that part of the end portion of the auxiliary electrode 264 may contact an exposed surface of the interlayer dielectric 230 in the shared contact hole CTS. Alternatively, the end portion of the drain electrode 214 of the TFT 210 may extend longer into the shared contact hole CTS than the end portion of the auxiliary electrode 264. In this case, the auxiliary electrode 264 may be formed to cover only a portion of the drain electrode 214 of the TFT 210.

Also, the drain electrodes 214 of the TFTs 210 of adjacent pixels P may be formed to face each other in the shared contact hole CTS. Additionally, the auxiliary electrodes 264 of adjacent pixels P may be formed to face each other in the shared contact hole CTS. Therefore, the auxiliary electrode 264 may be disconnected from another auxiliary electrode 264 adjacent thereto in the shared contact hole CTS, and the drain electrode 214 may be disconnected from another drain electrode 214 adjacent thereto in the shared contact hole CTS.

The auxiliary electrode 264 may be formed of a transparent metal material or an opaque metal material. The transparent metal material may be a transparent conductive material (or transparent conductive oxide (TCO)), such as indium tin oxide (ITO) or indium zinc oxide (IZO), or a semi-transmissive conductive material such as magnesium (Mg), silver (Ag), or an alloy of Mg and Ag. The opaque metal material may be Al, Ag, Mo, a stacked structure (Mo/Ti) of Mo and Ti, Cu, a stacked structure of Al and Ti, a stacked structure (ITO/Al/ITO) of Al and ITO, an APC alloy, or a stacked structure (ITO/APC/ITO) of an APC alloy and ITO. The APC alloy may be an alloy of Ag, palladium (Pd), and Cu.

The second planarization layer 271 may be formed on the auxiliary electrode 264 and in the shared contact hole CTS. The second planarization layer 271 may be formed to fill the shared contact hole CTS. The second planarization layer 271 may be formed of an organic layer such as acryl resin, epoxy resin, phenolic resin, polyamide resin, polyimide resin, or the like.

The first electrode 261 may be formed on the auxiliary electrode 264 and the second planarization layer 272. The first electrode 261 may be formed of aluminum (Al), silver (Ag), molybdenum (Mo), a stacked structure (Mo/Ti) of Mo and titanium (Ti), copper (Cu), a stacked structure of Al and Ti, a stacked structure (ITO/Al/ITO) of Al and indium tin oxide (ITO), an APC alloy, or a stacked structure (ITO/APC/ITO) of an APC alloy and ITO. The APC alloy may be an alloy of Ag, palladium (Pd), and Cu.

The bank 272 may be formed on the second planarization layer 272. Further, the bank 272 may be formed to cover an edge portion of the first electrode 261 that extends over the shared contact hole CTS. The bank 272 may define a plurality of emissive areas EA.

Each of the emissive areas EA may denote an area where the first electrode 261 corresponding to an anode electrode, the organic light emitting layer 262, and the second electrode 263 corresponding to a cathode electrode are sequentially stacked, and a hole from the first electrode 261 and an electron from the second electrode 263 are combined in the organic light emitting layer to emit light. In this case, an area where the bank 272 is provided does not emit light, and thus, may be defined as a non-emissive area.

As described above, in an embodiment of the present disclosure, the auxiliary electrode 264 instead of the first electrode 261 may be connected to a source electrode or the drain electrode 214 of the TFT 210 in the shared contact hole CTS. In this case, in an embodiment of the present disclosure, the auxiliary electrode 264 may not be connected to another auxiliary electrode 264 adjacent thereto in the shared contact hole CTS. Accordingly, in an embodiment of the present disclosure, since adjacent pixels P share the shared contact hole CTS, the emissive area EA is prevented from being reduced by the shared contact hole CTS, thereby preventing a lifetime of the organic light emitting layer from being shortened due to the reduction in the emissive area EA.

Moreover, according to an embodiment of the present disclosure, the first electrode 261 may be formed on the second planarization layer 271, and the bank 272 may be formed on the second planarization layer 271 and covering an edge of the first electrode 261. Therefore, according to an embodiment of the present disclosure, the first electrode 261 may be widely formed up to, and even extending partially over, the second planarization layer 271, thereby enlarging the emissive area EA. Accordingly, according to an embodiment of the present disclosure, a lifetime of the organic light emitting layer is improved.

Figure 12:
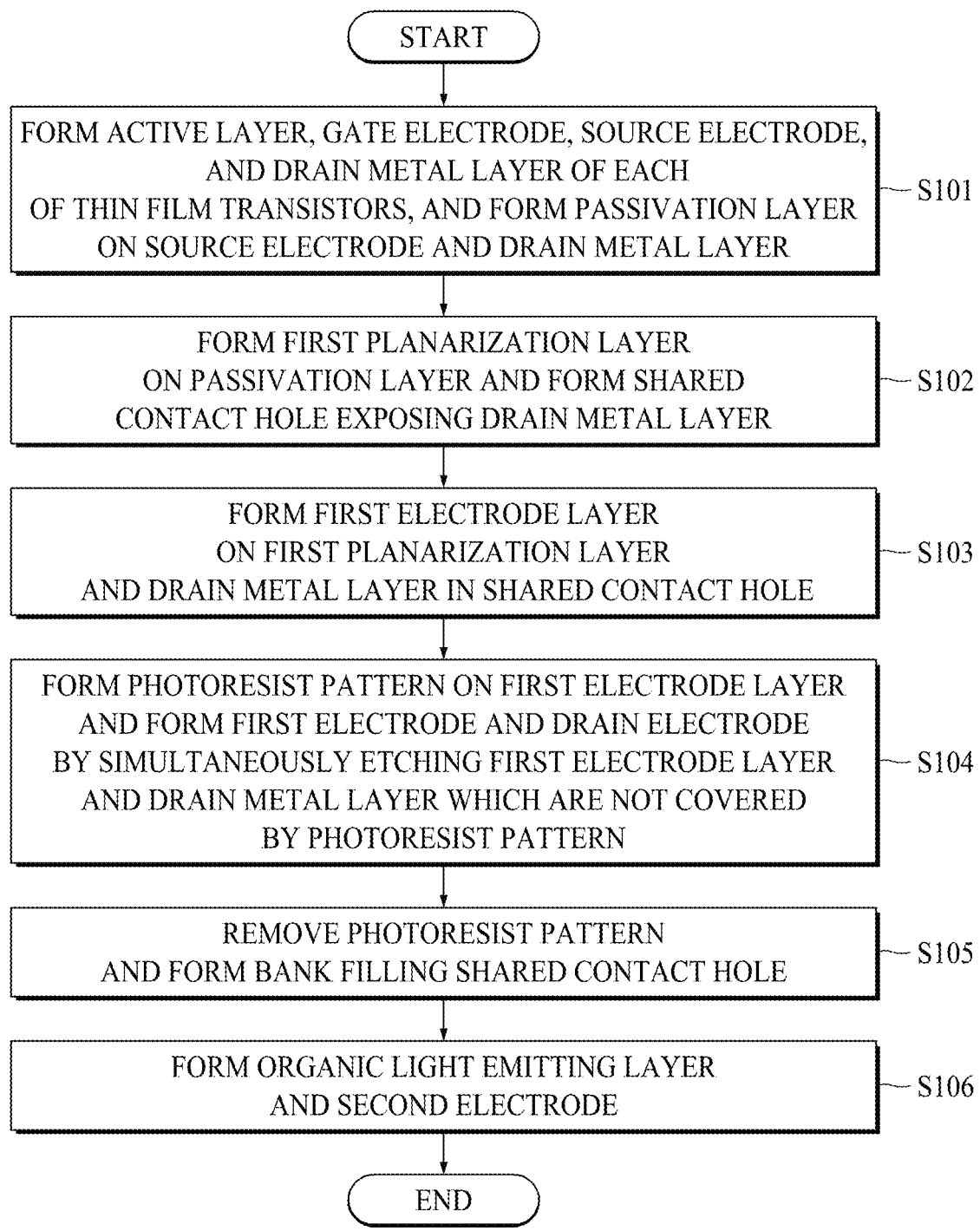
FIG. 12 is a flowchart illustrating a method of manufacturing an organic light emitting display device according to one or more embodiments of the present disclosure.

FIG. 12 is a flowchart illustrating a method of manufacturing an organic light emitting display device according to an embodiment of the present disclosure. FIGS. 13A to 13G are cross-sectional views taken along the line I-I' of FIG. 4 at various stages of manufacture, for describing a method of manufacturing an organic light emitting display device according to an embodiment of the present disclosure.

The cross-sectional views illustrated in FIGS. 13A to 13G relate to the method of manufacturing the organic light emitting display device illustrated in FIG. 7, and thus, like reference numerals refer to like elements. Hereinafter, a method of manufacturing an organic light emitting display device according to an embodiment of the present disclosure will be described in detail with reference to FIGS. 12 and 13A to 13G.

At S101, with reference to FIG. 13A, an active layer 211, a gate electrode 212, a source electrode 213, and a drain metal layer 214' which are included in each of a plurality of TFTs 210 may be formed, and a passivation layer 240 may be formed on the source electrode 213 and the drain metal layer 214' of each of the TFTs 210.

In detail, before the TFTs 210 are formed, a buffer layer may be formed on a first substrate 111, for protecting the TFTs 210 from water penetrating through a substrate 100. The buffer layer may include a plurality of inorganic layers which are alternately stacked, for protecting the TFTs 210 and an organic light emitting device 260 from water which penetrates through the first substrate 111, which may be vulnerable to penetration of water. For example, the buffer layer may be formed of a multilayer where one or more inorganic layers of silicon oxide (SiOx), silicon nitride (SiNx), and SiON are alternately stacked. The buffer layer may be formed by using a chemical vapor deposition (CVD) process.

Subsequently, the active layer 211 of each of the TFTs 210 may be formed on the buffer layer. In detail, an active metal layer may be formed all over the buffer layer by using a sputtering process, a metal organic chemical vapor (MOCVD) process, or the like. Subsequently, the active layer 211 may be formed by patterning the active metal layer through a mask process using a photoresist pattern. The active layer 211 may be formed of a silicon-based semiconductor material, an oxide-based semiconductor material, or the like.

Subsequently, a gate insulation layer 220 may be formed on the active layer 211. The gate insulation layer 220 may be formed of an inorganic layer, for example, silicon oxide (SiOx), silicon nitride (SiNx), or a multilayer thereof.

Subsequently, the gate electrode 212 of each of the TFTs 210 may be formed on the gate insulation layer 220. In detail, a first metal layer may be formed all over the gate insulation layer 220 by using a sputtering process, an MOCVD process, or the like. Subsequently, the gate electrode 212 may be formed by patterning the first metal layer through a mask process using a photoresist pattern. The gate electrode 212 may be formed of a single layer or a multilayer which includes one of molybdenum (Mo), chromium (Cr), titanium (Ti), nickel (Ni), neodymium (Nd), and copper (Cu), or an alloy thereof.

Subsequently, an interlayer dielectric 230 may be formed on the gate electrode 212. The interlayer dielectric 230 may be formed of an inorganic layer, for example, SiOx, SiNx, or a multilayer thereof.

Subsequently, a plurality of source and drain contact holes which pass through the gate insulation layer 220 and the interlayer dielectric 230 to expose the source and drain regions of the active layer 211 may be formed.

Subsequently, the source electrode 213 and the drain metal layer 214' of each of the TFTs 210 may be formed on the interlayer dielectric 230. In detail, a second metal layer may be formed all over the interlayer dielectric 230 and into the source and drain contact holes by using a sputtering process, an MOCVD process, or the like. Subsequently, the source electrode 213 and the drain metal layer 214' may be formed by patterning the second metal layer through a mask process using a photoresist pattern. The source electrode 213 may contact the source region in one side of the active layer 211 through the source contact hole which passes through the gate insulation layer 220 and the interlayer dielectric 230. The drain metal layer 214' may contact the drain region in the other side of the active layer 211 through the drain contact hole which passes through the gate insulation layer 220 and the interlayer dielectric 230. The source electrode 213 and the drain metal layer 214' may each be formed of a single layer or a multilayer which includes one of Mo, Cr, Ti, Ni, Nd, and Cu, or an alloy thereof. Also, as in FIG. 13A, the drain metal layers 214' of adjacent pixels P may be connected to each other at this stage.

Subsequently, a passivation layer 240 may be formed on the source electrode 213 and the drain metal layer 214' of each of the TFTs 210, and on the interlayer dielectric 230. The passivation layer 240 may be formed of an inorganic layer, for example, SiOx, SiNx, or a multilayer thereof. The passivation layer 240 may be formed by using a CVD process.

At S102, with reference to FIG. 13B, a first planarization layer 250 may be formed on the passivation layer 240 and the drain metal layer 214', and a shared contact hole CTS which exposes the drain metal layer 214' may be formed.

In detail, the first planarization layer 250 for planarizing a step height caused by the TFT 210 may be formed on the passivation layer 240 and the drain metal layer 214'. The first planarization layer 250 may be formed of an organic layer such as acryl resin, epoxy resin, phenolic resin, polyamide resin, polyimide resin, or the like.

Subsequently, a photoresist pattern may be formed on the first planarization layer 250. In this case, the photoresist pattern may be formed in an area other than an area where a shared contact hole CTS is to be formed.

Subsequently, the shared contact hole CTS may be formed by etching the first planarization layer 250 which is not covered by the photoresist pattern to expose the drain metal layer 214', and then, the photoresist pattern may be removed.

At S103, with reference to FIG. 13C, a first electrode layer 261' may be formed on the first planarization layer 250 and on the drain metal layer 214' in the shared contact hole CTS.

At S104, with reference to FIG. 13D, a photoresist pattern PR may be formed on the first electrode layer 261', and a first electrode 261 and a drain electrode 214 may be formed by simultaneously etching the first electrode layer 261' and the drain metal layer 214' which are not covered by the photoresist pattern PR. That is, the photoresist pattern PR is formed to expose the first electrode 261' in the shared contact hole CTS. The exposed portion of the first electrode 261' in the shared contact hole CTS is then etched, and the portion of the drain metal layer 214' underlying the exposed portion of the first electrode 261' in the shared contact hole CTS is also etched in the same process. The etching thus forms the first electrode 261 and the drain electrode 214. In this case, as shown in FIG. 13C, an end portion of the first electrode 261 may match a corresponding end portion of the drain electrode 214.

At S105, the photoresist pattern PR may be removed, and a bank 270 filling the shared contact hole CTS may be formed.

In detail, as shown in FIG. 13E, a bank layer 270' may be formed on the first electrode 261 and filling the shared contact hole CTS. The bank layer 270' may be formed of acryl resin, epoxy resin, phenolic resin, polyamide resin, polyimide resin, or the like. The bank layer 270' may be formed on the first planarization layer 250 and the first electrode 261 by using a slit coating process, a spin coating process, an evaporation process, or the like. The bank layer 270' may be filled into the contact hole CTS.

Subsequently, as shown in FIG. 13F, a bank 270 may be formed by dry-etching the bank layer 270' without a mask. A dry etching material may be selected as a material which is capable of etching the bank layer 270' but cannot etch the first electrode 261. The bank 270 may be formed to be substantially coplanar with the first electrode 261, as shown.

At S106, with reference to FIG. 13G, an organic light emitting layer 262 and a second electrode 263 may be formed on the first electrode 261 and the bank 270.

In detail, the organic light emitting layer 262 may be formed on the first electrode 261 and the bank 270 through a deposition process or a solution process. The organic light emitting layer 262 may be a common layer which is formed in each of the pixels P in common. In this case, the organic light emitting layer 262 may be a white light emitting layer that emits white light.

If the organic light emitting layer 262 is the white light emitting layer, the organic light emitting layer 262 may be formed in a tandem structure of two or more stacks. Each of the stacks may include a hole transporting layer, at least one light emitting layer, and an electron transporting layer. Also, a charge generating layer may be formed between the stacks.

The hole transporting layer may smoothly transfer a hole, injected from the first electrode 261 or the charge generating layer, to the organic light emitting layer 262. The light organic emitting layer 262 may be formed of an organic material including a phosphorescent material or a fluorescent material, and thus, may emit certain light. The electron transporting layer may smoothly transfer an electron, injected from the second electrode 263 or the charge generating layer, to the organic light emitting layer 262.

The charge generating layer may include an n-type charge generating layer, disposed adjacent to a lower stack, and a p-type charge generating layer which is formed on the n-type charge generating layer and is disposed adjacent to an upper stack. The n-type charge generating layer may inject an electron into the lower stack, and the p-type charge generating layer may inject a hole into the upper stack. The n-type charge generating layer may be formed of an organic layer which is doped with an alkali metal, such as lithium (Li), sodium (Na), potassium (K), or cesium (Cs), or an alkali earth metal such as magnesium (Mg), strontium (Sr), barium (Ba), or radium (Ra). The p-type charge generating layer may be an organic layer which is formed by doping an organic host material with a dopant having an ability to transport holes.

Subsequently, a second electrode 263 may be formed on the organic light emitting layer 262. The second electrode 263 may be a common layer which is formed in each of the pixels P in common. The second electrode 263 may be formed of a transparent conductive material (or TCO), such as indium tin oxide (ITO) or indium zinc oxide (IZO) capable of transmitting light, or a semi-transmissive conductive material such as Mg, Ag, or an alloy of Mg and Ag. In a case where the second electrode 263 is formed of the semi-transmissive conductive material, emission efficiency may be enhanced by a micro-cavity. The second electrode 263 may be formed through a physical vapor deposition (PVD) process such as a sputtering process. A capping layer may be formed on the second electrode 263.

Subsequently, an encapsulation layer 280 may be formed on the second electrode 263. The encapsulation layer 280 prevents oxygen or water from penetrating into the organic light emitting layer 262 and the second electrode 263. The encapsulation layer 280 may include at least one inorganic layer. The inorganic layer may be formed of silicon nitride, aluminum nitride, zirconium nitride, titanium nitride, hafnium nitride, tantalum nitride, silicon oxide, aluminum oxide, titanium oxide, or the like.

Also, the encapsulation layer 280 may further include at least one organic layer. The organic layer may be formed to have a sufficient thickness for preventing particles from penetrating into the organic light emitting layer 262 and the second electrode 263 via the encapsulation layer 280.

Subsequently, the second substrate 112 where a plurality of color filters 301 and 302 and a black matrix 310 are provided may be bonded to the first substrate 111. The color filters 301 and 302 on the second substrate 112 may be adhered to the encapsulation layer 280 on the first substrate 111 by an adhesive layer 290. The adhesive layer 290 may be a transparent adhesive film, a transparent adhesive resin, or the like.

As described above, in an embodiment of the present disclosure, the drain electrode 214 and the first electrode 261 may be formed by simultaneously etching the drain metal layer 214' and the first electrode layer 261', in the shared contact hole CTS. As a result, in an embodiment of the present disclosure, the first electrode 261 may not be connected to another first electrode 261 adjacent thereto in the shared contact hole CTS. Accordingly, in an embodiment of the present disclosure, since adjacent pixels P share the shared contact hole CTS, the emissive area EA is prevented from being reduced by the shared contact hole CTS, thereby preventing a lifetime of the organic light emitting layer from being shortened due to the reduction in the emissive area EA.

Moreover, according to an embodiment of the present disclosure, the drain electrode 214 and the first electrode 261 may be formed by simultaneously etching the drain metal layer 214' and the first electrode layer 261' in the shared contact hole CTS, thereby preventing the first electrode 261 from being disconnected in a side surface of the source or drain electrode due to a step height between a floor of a contact hole and the drain electrode. Accordingly, in an embodiment of the present disclosure, a turn-on defect where a pixel does not emit light is prevented from occurring.

Figure 14:
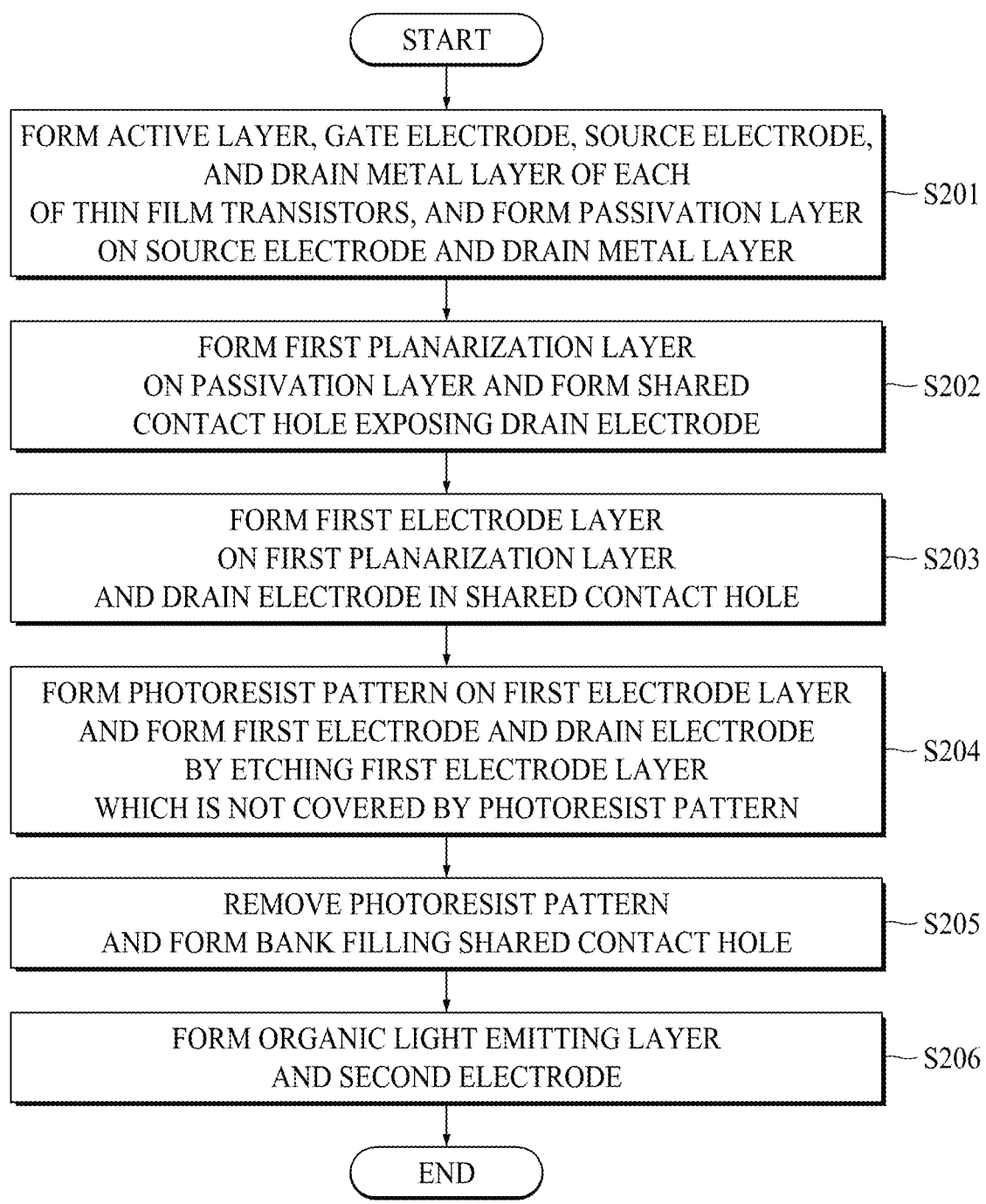
FIG. 14 is a flowchart illustrating a method of manufacturing an organic light emitting display device according to another embodiment of the present disclosure.

FIG. 14 is a flowchart illustrating a method of manufacturing an organic light emitting display device according to another embodiment of the present disclosure. FIGS. 15A to 15D are cross-sectional views taken along the line IV-IV' of FIG. 8 at various stages of manufacture, for describing a method of manufacturing an organic light emitting display device according to another embodiment of the present disclosure.

The cross-sectional views illustrated in FIGS. 15A to 15D relate to the method of manufacturing the organic light emitting display device illustrated in FIG. 9, and thus, like reference numerals refer to like elements. Hereinafter, a method of manufacturing an organic light emitting display device according to an embodiment of the present disclosure will be described in detail with reference to FIGS. 14 and 15A to 15D.

Figure 15A:
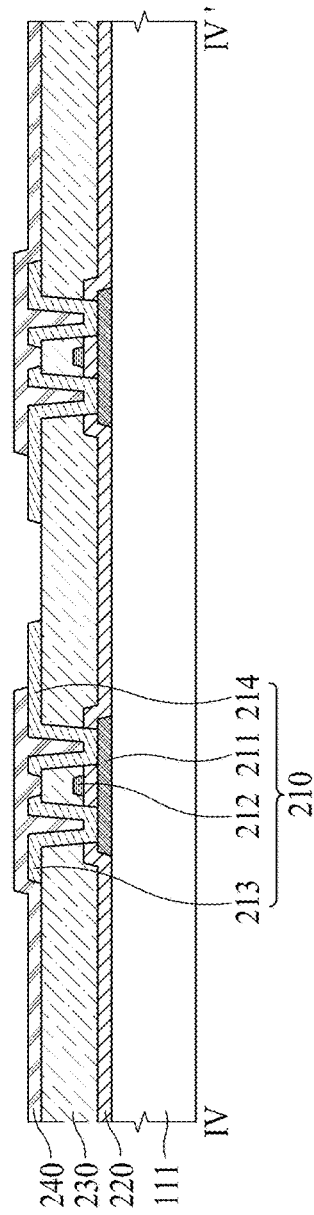

At S201, with reference to FIG. 15A, an active layer 211, a gate electrode 212, a source electrode 213, and a drain electrode 214 which are included in each of a plurality of TFTs 210 may be formed, and a passivation layer 240 may be formed on the source electrode 213 and the drain electrode 214 of each of the TFTs 210.

A method of forming the active layer 211 and the gate electrode 212 of each of the TFTs 210, the gate insulation layer 220, and the interlayer dielectric 230 is substantially the same as the operation (S101) of FIG. 12 described above with reference to FIG. 13A, and thus, its detailed description is omitted.

The source electrode 213 and the drain electrode 214 of each of the TFTs 210 may be formed on the interlayer dielectric 230. In detail, a second metal layer may be formed all over the interlayer dielectric 230 by using a sputtering process, an MOCVD process, or the like. Subsequently, the source electrode 213 and the drain electrode 214 may be formed by patterning the second metal layer through a mask process using a photoresist pattern. The source electrode 213 may contact one side of the active layer 211 through a source contact hole which passes through the gate insulation layer 220 and the interlayer dielectric 230. The drain electrode 214 may contact the other side of the active layer 211 through a drain contact hole which passes through the gate insulation layer 220 and the interlayer dielectric 230. The source electrode 213 and the drain electrode 214 may each be formed of a single layer or a multilayer which includes one of Mo, Cr, Ti, Ni, Nd, and Cu, or an alloy thereof.

Subsequently, a passivation layer 240 may be formed on the source electrode 213 and the drain electrode 214 of each of the TFTs 210, and on the interlayer dielectric 230. The passivation layer 240 may be formed of an inorganic layer, for example, SiOx, SiNx, or a multilayer thereof. The passivation layer 240 may be formed by using a CVD process.

Figure 15B:
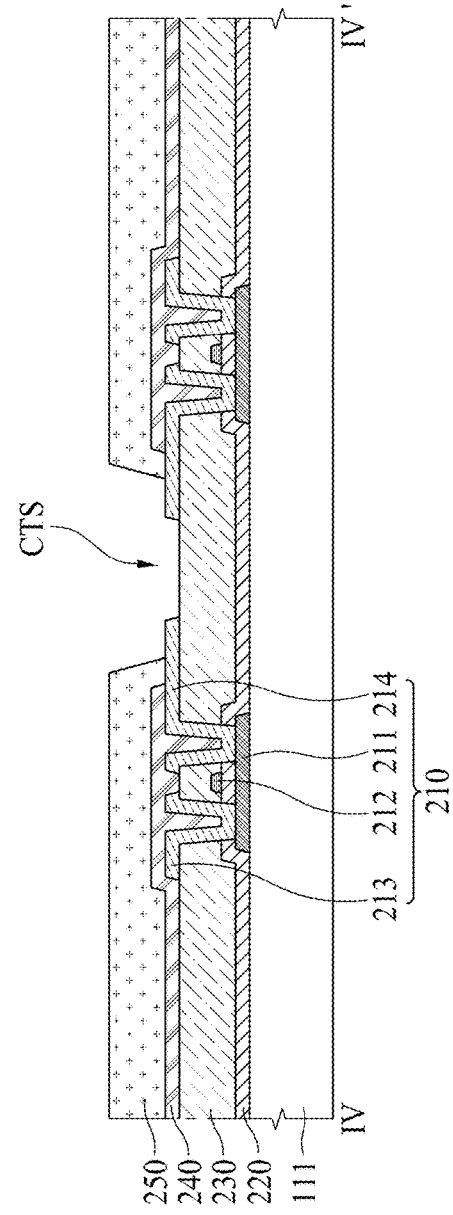

At S202, with reference to FIG. 15B, a first planarization layer 250 may be formed on the passivation layer 240 and the drain electrode 214, and a shared contact hole CTS which exposes the drain electrode 214 may be formed.

The first planarization layer 250 for planarizing a step height caused by the TFTs 210 may be formed on the passivation layer 240. The first planarization layer 250 may be formed of an organic layer such as acryl resin, epoxy resin, phenolic resin, polyamide resin, polyimide resin, or the like.

Subsequently, a photoresist pattern may be formed on the first planarization layer 250. In this case, the photoresist pattern may be formed in an area other than an area where a shared contact hole CTS is to be formed.

Subsequently, the shared contact hole CTS may be formed by etching the first planarization layer 250 which is not covered by the photoresist pattern to expose the end portion of the drain electrode 214, and then, the photoresist pattern may be removed.

At S203, with reference to FIG. 15C, a first electrode layer 261' may be formed on the first planarization layer 250 and on the drain electrode 214 in the shared contact hole CTS.

At S204, with reference to FIG. 15D, a photoresist pattern PR may be formed on the first electrode layer 261', and a first electrode 261 may be formed by etching the first electrode layer 261' which is not covered by the photoresist pattern PR.

For example, as shown in FIG. 15D, an end portion of the first electrode 261 of the organic light emitting device 260 may extend longer into the shared contact hole CTS than an end portion of the drain electrode 214 of the TFT 210. In this case, the first electrode 261 of the organic light emitting device 260 may be formed to fully cover the drain electrode 214 of the TFT 210. Alternatively, the end portion of the drain electrode 214 of the TFT 210 may extend longer than the end portion of the first electrode 261 of the organic light emitting device 260, in the shared contact hole CTS. In this case, the first electrode 261 of the organic light emitting device 260 may be formed to cover a portion of the drain electrode 214 of the TFT 210.

At S205, the photoresist pattern PR may be removed, and a bank 270 filling the shared contact hole CTS may be formed.

An operation (S205) of FIG. 14 is substantially the same as the operation (S105) of FIG. 12 described above with reference to FIGS. 13E and 13F. Therefore, a detailed description of the operation (S205) of FIG. 14 is omitted.

At S206, an organic light emitting layer 262 and a second electrode 263 may be formed on the first electrode 261 and the bank 270.

An operation (S206) of FIG. 14 is substantially the same as the operation (S106) of FIG. 12 described above with reference to FIG. 13G. Therefore, a detailed description of the operation (S206) of FIG. 14 is omitted.

As described above, in an embodiment of the present disclosure, the first electrode 261 may be formed by etching the first electrode 261', in the shared contact hole CTS. As a result, in an embodiment of the present disclosure, the first electrode 261 may not be connected to another first electrode 261 adjacent thereto in the shared contact hole CTS. Accordingly, in an embodiment of the present disclosure, since adjacent pixels P share the shared contact hole CTS, the emissive area EA is prevented from being reduced by the shared contact hole CTS, thereby preventing a lifetime of the organic light emitting layer from being shortened due to the reduction in the emissive area EA.

Moreover, according to an embodiment of the present disclosure, the first electrode layer 261' may be formed to cover the drain electrode 214 and the first electrode 261 may be formed by etching part of the first electrode layer 261' in the shared contact hole CTS, thereby preventing the first electrode from being disconnected in a side surface of the source or drain electrode due to a step height between a floor of a contact hole and the drain electrode. Accordingly, in an embodiment of the present disclosure, a turn-on defect where a pixel does not emit light is prevented from occurring.

Figure 16:
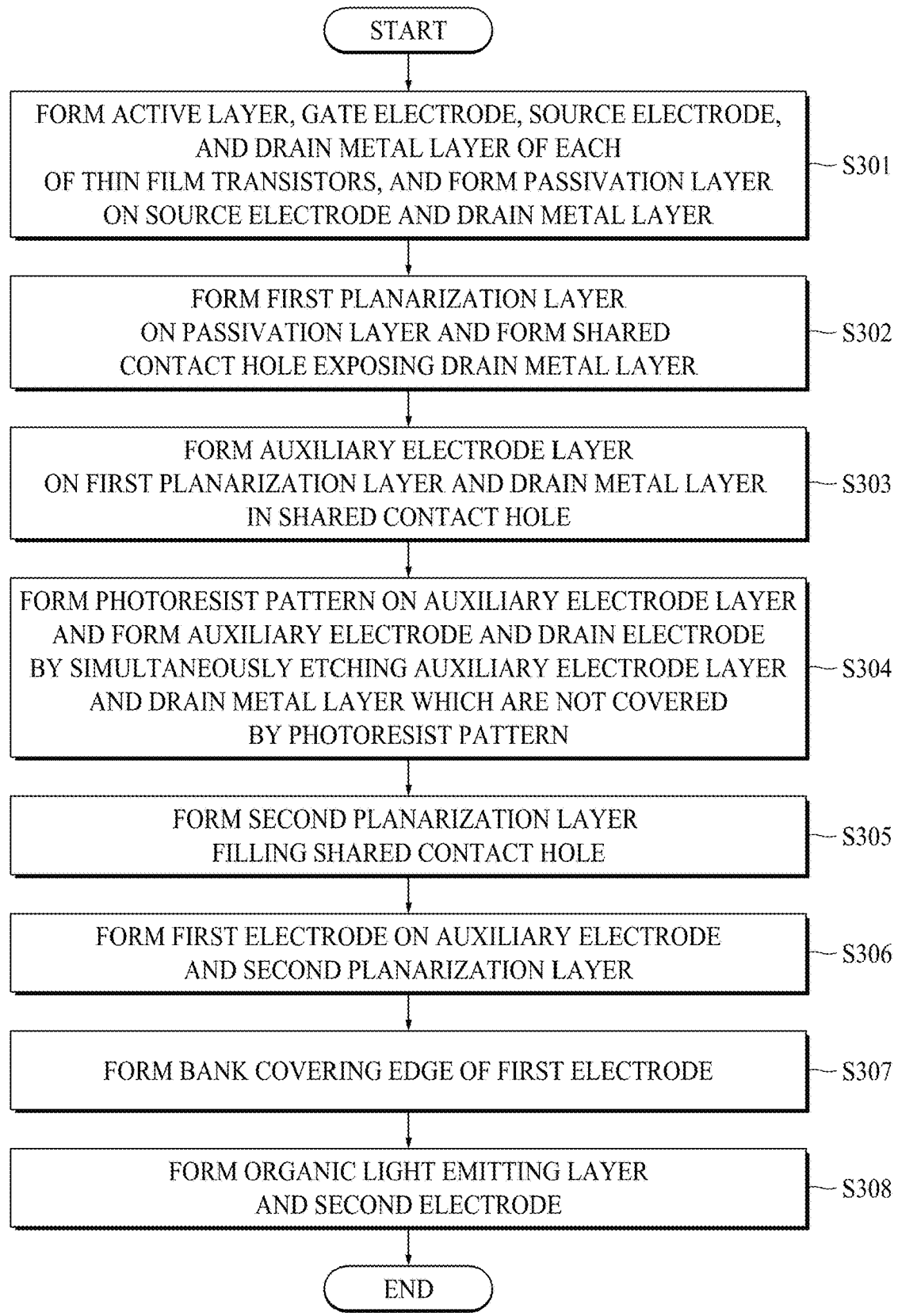
FIG. 16 is a flowchart illustrating a method of manufacturing an organic light emitting display device according to another embodiment of the present disclosure.

FIG. 16 is a flowchart illustrating a method of manufacturing an organic light emitting display device according to another embodiment of the present disclosure. FIGS. 17A to 17D are cross-sectional views taken along the line V-V' of FIG. 10 at various stages of manufacture, for describing a method of manufacturing an organic light emitting display device according to another embodiment of the present disclosure.

The cross-sectional views illustrated in FIGS. 17A to 17D relate to the method of manufacturing the organic light emitting display device illustrated in FIG. 11, and thus, like reference numerals refer to like elements. Hereinafter, a method of manufacturing an organic light emitting display device according to an embodiment of the present disclosure will be described in detail with reference to FIGS. 16 and 17A to 17D.

At S301, an active layer 211, a gate electrode 212, a source electrode 213, and a drain metal layer 214' which are included in each of a plurality of TFTs 210 may be formed, and a passivation layer 240 may be formed on the source electrode 213 and the drain metal layer 214' of each of the TFTs 210.

An operation (S301) of FIG. 16 is substantially the same as the operation (S101) of FIG. 12 described above with reference to FIG. 13A. Therefore, a detailed description of the operation (S301) of FIG. 16 is omitted.

At S302, a first planarization layer 250 may be formed on the passivation layer 240, and a shared contact hole CTS which exposes the drain metal layer 214' may be formed.

An operation (S302) of FIG. 16 is substantially the same as the operation (S102) of FIG. 12 described above with reference to FIG. 13B. Therefore, a detailed description of the operation (S302) of FIG. 16 is omitted.

At S303, an auxiliary electrode layer 264' may be formed on the first planarization layer 250 and the drain metal layer 214' in the shared contact hole CTS.

Except that the first electrode layer 261' is replaced with the auxiliary electrode layer 264' in FIG. 13C, an operation (S303) of FIG. 16 is substantially the same as the operation (S103) of FIG. 12 described above with reference to FIG. 13C.

At S304, a photoresist pattern PR may be formed on the auxiliary electrode layer 264', and an auxiliary electrode 264 and a drain electrode 214 may be formed by simultaneously etching the auxiliary electrode layer 264' and the drain metal layer 214' which are not covered by the photoresist pattern PR.

Except that the first electrode 261 is replaced with the auxiliary electrode 264 in FIG. 13D, an operation (S304) of FIG. 16 is substantially the same as the operation (S104) of FIG. 12 described above with reference to FIG. 13D.

At S305, with reference to FIGS. 17A and 17B, the photoresist pattern PR may be removed, and a second planarization layer 271 filling the shared contact hole CTS may be formed.

In detail, as shown in FIG. 17A, a second planarization material 271' may be formed on the auxiliary electrode 264 and in the shared contact hole CTS. The second planarization material 271' may be formed of acryl resin, epoxy resin, phenolic resin, polyamide resin, polyimide resin, or the like. The second planarization material 271' may be formed on the first planarization layer 250 and the auxiliary electrode 264 by using a slit coating process, a spin coating process, an evaporation process, or the like. The second planarization material 271' may be filled into the shared contact hole CTS.

Subsequently, as shown in FIG. 17B, a second planarization layer 271 may be formed by dry-etching the second planarization material 271' without a mask. A dry etching material may be selected as a material which is capable of etching the second planarization material 271' but cannot etch the auxiliary electrode 264.

At S306, with reference to FIG. 17C, a first electrode 261 may be formed on the auxiliary electrode 264 and the second planarization layer 271.

At S307, with reference to FIG. 17D, a bank 272 covering an edge portion of the first electrode 261 may be formed on the second planarization layer 271. The bank 272 may define a plurality of emissive areas EA. In this case, an area where the bank 272 is provided does not emit light, and thus, may be defined as a non-emissive area.

At S308, an organic light emitting layer 262 and a second electrode 263 may be formed on the first electrode 261 and the bank 272.

An operation (S308) of FIG. 16 is substantially the same as the operation (S106) of FIG. 12 described above with reference to FIG. 13G. Therefore, a detailed description of the operation (S308) of FIG. 16 is omitted.

As described above, according to an embodiment of the present disclosure, the first electrode 261 may be formed on the second planarization layer 271, and the bank 272 covering an edge of the first electrode 261 may be formed on the second planarization layer 271. Therefore, according to an embodiment of the present disclosure, the first electrode 261 may be widely formed up to, and may extend partially over, the second planarization layer 271, thereby enlarging the emissive area EA. Accordingly, according to an embodiment of the present disclosure, a lifetime of the organic light emitting layer is improved.

By way of summation and review, according to the embodiments of the present disclosure, adjacent pixels may share the shared contact hole for connecting the first electrode of the organic light emitting device to the drain electrode of the TFT. Accordingly, in the embodiments of the present disclosure, an emissive area is prevented from being reduced by the shared contact hole, thereby preventing a lifetime of an organic light emitting layer from being shortened due to the reduction in the emissive area.

Moreover, according to the embodiments of the present disclosure, the first electrode may be formed by etching the first electrode layer in the shared contact hole, thereby preventing the first electrode from being disconnected in a side surface of the source or drain electrode due to a step height between a floor of a contact hole and the drain electrode. Accordingly, in the embodiments of the present disclosure, a turn-on defect where a pixel does not emit light is prevented from occurring.

Moreover, according to the embodiments of the present disclosure, the first electrode may be formed on the second planarization layer, and the bank covering an edge of the first electrode may be formed on the second planarization layer. Therefore, according to the embodiments of the present disclosure, the first electrode may be widely formed up to the second planarization layer, thereby enlarging the emissive area. Accordingly, according to the embodiments of the present disclosure, a lifetime of the organic light emitting layer is improved.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A light emitting display device comprising:
   a plurality of pixels, each of the pixels including:
      a transistor having a gate electrode, a source region, and a drain region;
      a source electrode coupled to the source region;
      a drain electrode coupled to the drain region;
      a first planarization layer on the source and drain electrodes;
      an auxiliary electrode on a surface of the first planarization layer, the auxiliary electrode including a first end and a second end opposite the first end;
      a second planarization layer having a first portion on the surface of the first planarization layer and abutting the first end of the auxiliary electrode; and a first electrode of a light emitting device on the auxiliary electrode, the first electrode extending beyond the first end of the auxiliary electrode and in contact with the first portion of the second planarization layer, the first portion of the second planarization layer being between the first electrode and the first planarization layer; and a contact hole, the second ends of the auxiliary electrodes of at least two of the pixels being electrically connected to respective source electrodes or to respective drain electrodes in the contact hole, wherein a second portion of the second planarization layer at least partially fills the contact hole.

2. The light emitting display device of claim 1 wherein the second ends of the auxiliary electrodes match corresponding end portions of the respective source electrodes or the respective drain electrodes in the contact hole.

3. The light emitting display device of claim 1 wherein the second ends of the auxiliary electrodes cover corresponding end portions of the respective source electrodes or the respective drain electrodes in the contact hole.

4. The light emitting display device of claim 3, further comprising:

an interlayer dielectric, wherein the second portion of the second planarization layer contacts the interlayer dielectric in the contact hole, and the second ends of the auxiliary electrodes of the at least two of the pixels contact the interlayer dielectric in the contact hole.

5. The light emitting display device of claim 1, wherein the first electrode of the light emitting device is disposed on the second portion of the second planarization layer.

6. The light emitting display device of claim 5, further comprising a bank covering an edge of the first electrode of the light emitting device on the second portion of the second planarization layer.

7. The light emitting display device of claim 6 wherein a first end portion of the first electrode contacts the second portion of the second planarization layer.

8. The light emitting display device of claim 7 wherein a second end portion of the first electrode contacts the first portion of the second planarization layer, the second end portion being opposite the first end portion.

9. The light emitting display device of claim 5, further comprising an interlayer dielectric, the second portion of the second planarization layer contacts the interlayer dielectric in the contact hole.

10. The light emitting display device of claim 5, wherein the first planarization layer directly contacts at least one of the source electrode and the drain electrode.

* * * * *